United States Patent
Hung et al.

(10) Patent No.: US 10,770,437 B2
(45) Date of Patent: Sep. 8, 2020

(54) SEMICONDUCTOR PACKAGE AND MANUFACTURING METHOD OF THE SAME

(71) Applicant: TAIWAN SEMICONDUCTOR MANUFACTURING COMPANY LTD., Hsinchu (TW)

(72) Inventors: Jui-Pin Hung, Hsinchu (TW);
Feng-Cheng Hsu, New Taipei (TW);
Shuo-Mao Chen, New Taipei (TW);
Shin-Puu Jeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 12 days.

(21) Appl. No.: 16/100,002

(22) Filed: Aug. 9, 2018

(65) Prior Publication Data

US 2018/0350786 A1    Dec. 6, 2018

Related U.S. Application Data

(62) Division of application No. 15/370,865, filed on Dec. 6, 2016, now Pat. No. 10,050,024.

(Continued)

(51) Int. Cl.
*H01L 23/02* (2006.01)
*H01L 25/10* (2006.01)
(Continued)

(52) U.S. Cl.
CPC .......... *H01L 25/105* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/5383* (2013.01); *H01L 23/5386* (2013.01); *H01L 24/18* (2013.01); *H01L 25/0657* (2013.01); *H01L 25/50* (2013.01); *H01L 23/49816* (2013.01); *H01L 23/5384* (2013.01);
(Continued)

(58) Field of Classification Search
CPC ............ H01L 21/4853; H01L 21/4857; H01L 21/486; H01L 21/565; H01L 23/3224
USPC ........................................................ 257/686
See application file for complete search history.

(56) References Cited

U.S. PATENT DOCUMENTS

| | | | |
|---|---|---|---|
| 5,854,507 A | * | 12/1998 | Miremadi ............. H01L 25/105 257/686 |
| 8,716,065 B2 | * | 5/2014 | Chi ..................... H01L 23/3135 438/109 |

(Continued)

*Primary Examiner* — Nitin Parekh
(74) *Attorney, Agent, or Firm* — WPAT, P.C., Intellectual Property Attorneys; Anthony King

(57) ABSTRACT

The present disclosure provides a semiconductor package, including a first layer, a second layer, and a conductive array. The first layer includes a packaged die having a carrier surface and a molding surface, and a first die structure in proximity to the carrier surface. An active region of the first die structure is electrically coupled to the packaged die through a solder. The second layer includes a second die structure, the second die structure being connected to the active region of the first die structure by a first redistributed layer (RDL). The conductive array is connected to an active region of the second die structure by a second RDL. The present disclosure also provides a method for manufacturing the aforesaid semiconductor package.

20 Claims, 24 Drawing Sheets

Related U.S. Application Data

(60) Provisional application No. 62/351,509, filed on Jun. 17, 2016.

(51) Int. Cl.
| | | |
|---|---|---|
| *H01L 25/065* | (2006.01) | |
| *H01L 23/00* | (2006.01) | |
| *H01L 21/48* | (2006.01) | |
| *H01L 21/56* | (2006.01) | |
| *H01L 23/31* | (2006.01) | |
| *H01L 23/538* | (2006.01) | |
| *H01L 25/00* | (2006.01) | |
| *H01L 23/498* | (2006.01) | |

(52) U.S. Cl.
CPC ...... *H01L 23/5389* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/81005* (2013.01); *H01L 2224/81191* (2013.01); *H01L 2224/97* (2013.01); *H01L 2225/06517* (2013.01); *H01L 2225/06524* (2013.01); *H01L 2225/06527* (2013.01); *H01L 2225/1035* (2013.01); *H01L 2225/1058* (2013.01); *H01L 2225/1088* (2013.01); *H01L 2924/15311* (2013.01); *H01L 2924/181* (2013.01); *H01L 2924/18161* (2013.01); *H01L 2924/19105* (2013.01); *H01L 2924/19106* (2013.01)

(56) References Cited

U.S. PATENT DOCUMENTS

| | | | |
|---|---|---|---|
| 8,802,504 | B1 | 8/2014 | Hou et al. |
| 8,803,292 | B2 | 8/2014 | Chen et al. |
| 8,803,316 | B2 | 8/2014 | Lin et al. |
| 8,993,380 | B2 | 3/2015 | Hou et al. |
| 9,064,936 | B2* | 6/2015 | Lin .............. H01L 21/568 |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 2007/0164457 | A1* | 7/2007 | Yamaguchi ...... H01L 23/5389 257/787 |
| 2008/0073771 | A1* | 3/2008 | Seo ............... H01L 23/3128 257/686 |
| 2009/0115043 | A1* | 5/2009 | Chow ............. H01L 25/0657 257/686 |
| 2009/0140408 | A1* | 6/2009 | Lee ................ H01L 25/105 257/686 |
| 2011/0024899 | A1* | 2/2011 | Masumoto ...... H01L 23/49816 257/737 |
| 2011/0285009 | A1* | 11/2011 | Chi ................ H01L 21/561 257/693 |
| 2012/0074585 | A1* | 3/2012 | Koo .............. H01L 23/49827 257/774 |
| 2013/0214396 | A1* | 8/2013 | Kim ................ H01L 25/105 257/659 |
| 2014/0091455 | A1* | 4/2014 | Strothmann ..... H01L 21/6836 257/734 |
| 2014/0175671 | A1* | 6/2014 | Haba ............... H01L 23/528 257/777 |
| 2015/0187742 | A1* | 7/2015 | Kwon ............... H01L 24/82 257/774 |

\* cited by examiner

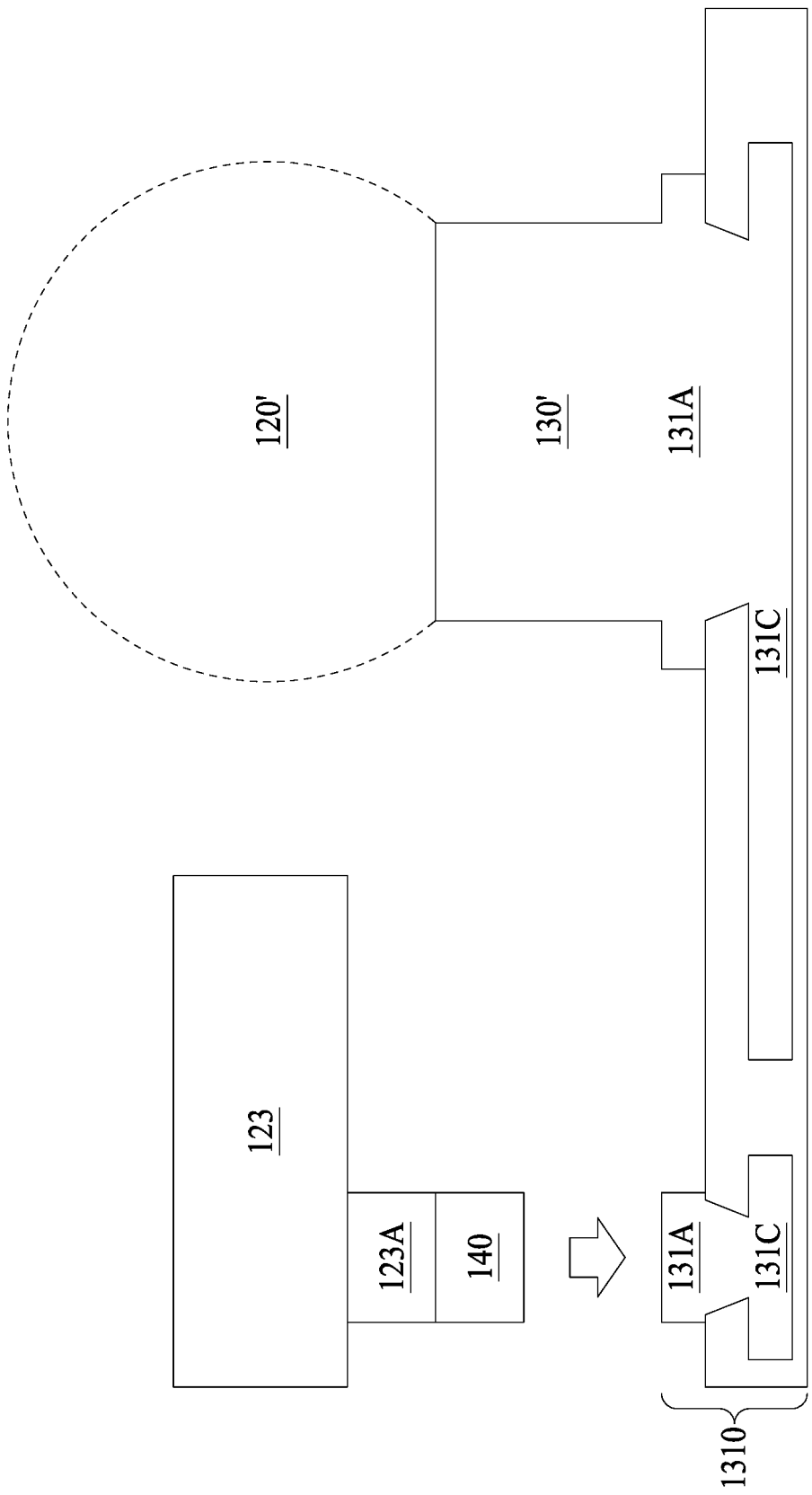

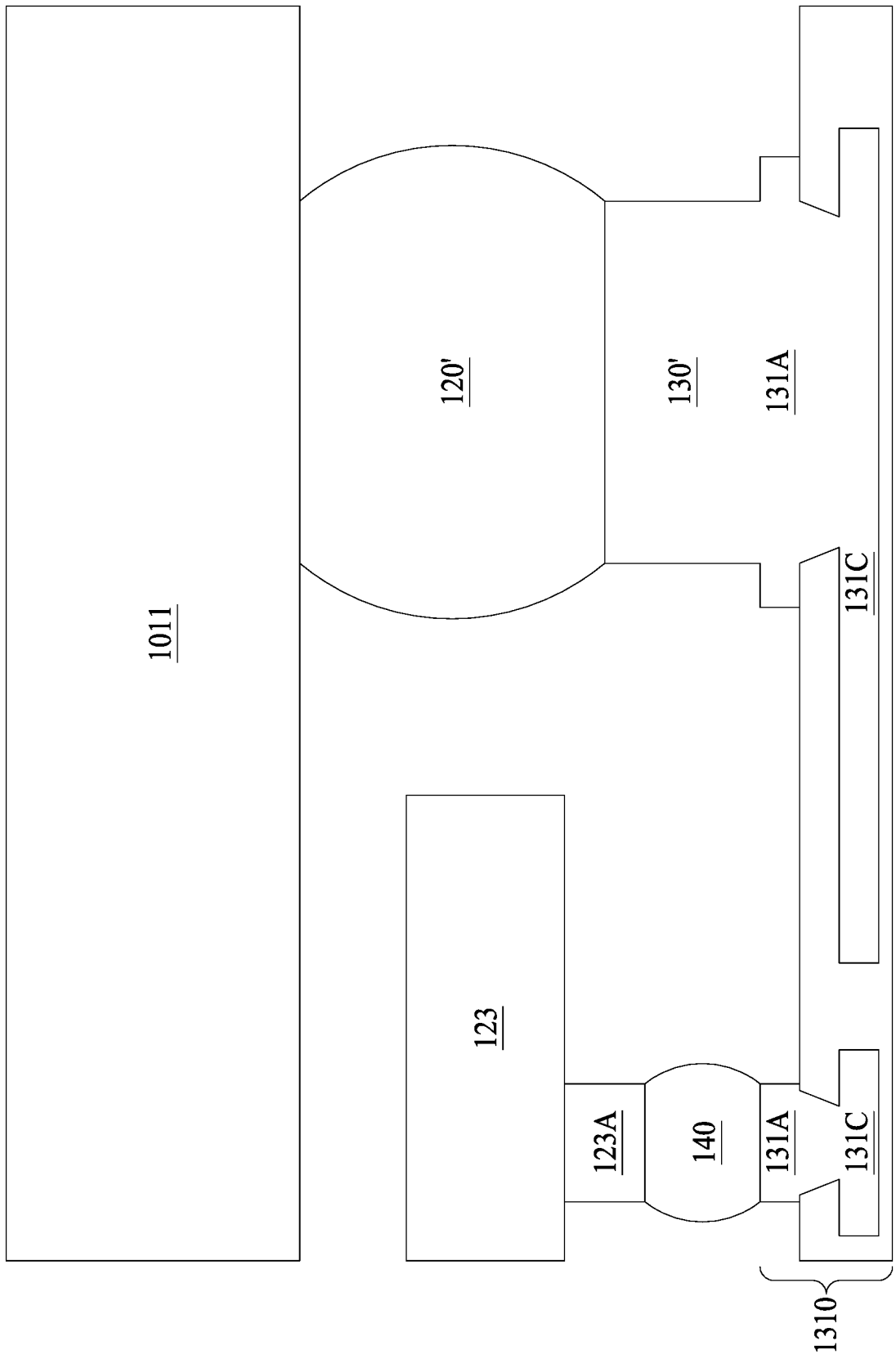

SEMICONDUCTOR PACKAGE AND MANUFACTURING METHOD OF THE SAME

PRIORITY CLAIM AND CROSS REFERENCE

This application is a divisional application to U.S. non-provisional application Ser. No. 15/370,865, filed Dec. 6, 2016, which is a regular application to U.S. provisional application No. 62/351,509, filed Jun. 17, 2016. This application claims priority thereto.

BACKGROUND

Semiconductor devices are used in a variety of electronic applications, such as personal computers, cell phones, digital cameras, and other electronic equipment. The fabrication of semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures, that utilize less area or smaller heights, are developed to package the semiconductor devices. For example, in an attempt to further increase circuit density, three-dimensional (3D) ICs have been investigated.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A and FIG. 5B show a portional enlarged cross sectional views of a semiconductor package, in accordance with some embodiments of the present disclosure;

DETAILED DESCRIPTION

Figure 1:
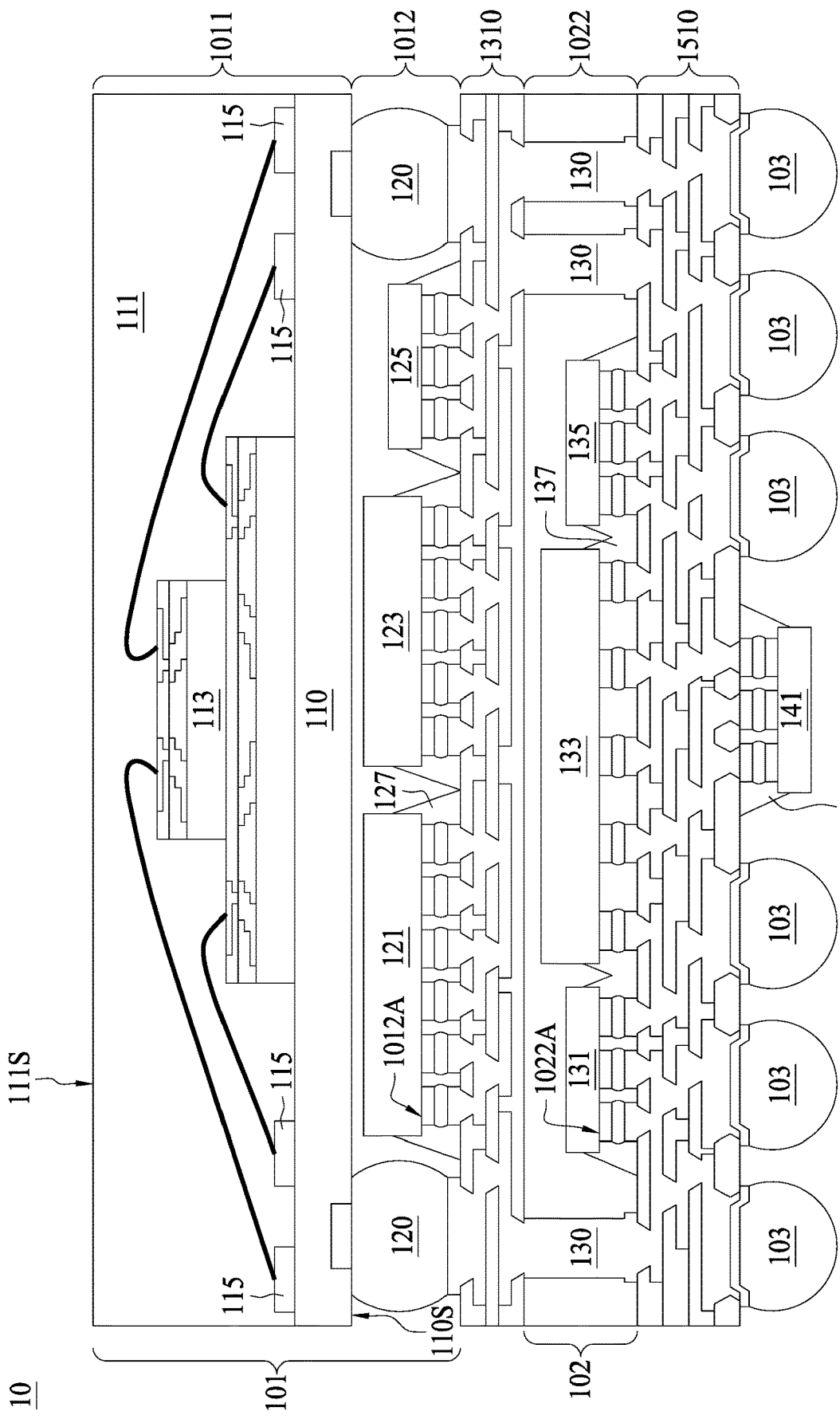
FIG. 1 is a cross sectional view of a semiconductor package, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Various embodiments include methods and corresponding structures for forming a semiconductor device package. Various embodiments integrate multiple functional chips in a single device package and implements Chip-to-Wafer (e.g., known good die) for Chip-on-Wafer (CoW) level packaging. Functional chips may be directly bonded to other functional chips using bonding layers (e.g., by fusion bonding and/or hybrid bonding) in order to reduce the need to form solder bumps (e.g., microbumps) and underfill. Various embodiments may further advantageously provide a system-in-package (SiP) solution with smaller form factor, increased input/output density, and low via aspect ratio. Thus, manufacturing errors and costs can be reduced.

The present application relates to a semiconductor package and its manufacturing method, and more particularly to a semiconductor package having a multiple-layer chip stacking by a package-on-package (PoP) fashion and a manufacturing method thereof.

The trend of vertical die/chip stacking can effectively reduce the occupied die/chip area on a printable circuit board (PCB). For example, a vertical stack of application die, a dynamic random access memory (DRAM), and a flash memory effectively shrinks the stand-alone area on the carrier. Optimal vertical signal connection between different layers are thus in need.

The general purpose of the present disclosure provides one or more of the following advantages: (1) creating a thermal-friendly operation sequence for thermal-sensitive devices such as NAND flash or DRAM; (2) optionally implementing fewer molding operations and hence alleviate the final package warpage; (3) implementing fewer through insulator vias (TIVs) for lower cost; (4) allowing chips with different thicknesses to be arranged in a same layer by flip-chip bonding; and (5) reducing final package height by including an embedded chip in one of the multi-layers.

The present disclosure also provides a microbump structure that can be implemented in the present semiconductor package. Provided microbump structure includes a necking section at the junction of a corresponding microbump receiver and conductive mesh in order to constrain solder wetting along the conductive mesh.

Referring to FIG. 1, FIG. 1 is a cross sectional view of a semiconductor package 10, in accordance with some embodiments of the present disclosure. Semiconductor package 10 includes a first layer 101 and a second layer 102. First layer 101 further includes a packaged die 1011 and a first die structure 1012. Packaged die 1011 has a, for example, stacked die 113 encapsulated by molding compound 111 and disposed over a carrier 110. The molding compound 111 can be an epoxy, polyimide, silicone rubber, the like, or a combination thereof. The molding compound 111 can be applied using acceptable techniques, such as compression molding. As shown in FIG. 1, the first layer 101 includes a molding surface 1115 and a carrier surface 1105 opposite to the molding surface 1115. First die structure 1012 broadly includes a plurality of dies 121, 123, 125, the electrical connection extending therefrom, and an inter-layer connection at the same level of the dies 121, 123, 125. As depicted in FIG. 1, the electrical connection includes solder 120 disposed around the dies 121, 123, 125 of the same layer.

In some embodiments, the stacked die 113 includes multiple dies vertically stacked and wire-bonded to the conductive traces 115 on the carrier 110. Wire bonding can be used to make the electrical connections from chip components such as chip resistors or chip capacitors to substrate. Two function chips are stacked on top of a plurality of substrate layers. The chips are connected to the substrate by a plurality of bonding gold wires. Other form of wires such as aluminum wire can be used, too. The function chips, the gold wire, and the substrate form a wire bonding (WB) package.

In some embodiments, die structure 1012 includes a several dies 121, 123, 125 flip-chip bonded to a first redistribution layer (RDL) 1310. An active region 1012A of the die structure 1012 is connected to the stacked die 113 through a solder 120, the conductive traces 115, and bonding wires. Active region 1012A includes interconnect structure extending from the body of the dies 121, 123, 125. Interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMD layers may include low-k dielectric materials having k values, for example, lower than about 4.0 or even 2.0 disposed between such conductive features. In some embodiments, the ILD and IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). Interconnect structure electrically connects various active devices to form functional circuits within dies 121, 123, 125. The functions provided by such circuits may include logic structures, memory structures, processing structures, sensors, amplifiers, power distribution, input/output circuitry, or the like. One of ordinary skill in the art will appreciate that the above examples are provided for illustrative purposes only to further explain applications of various embodiments and are non-limiting. Other circuitry may be used as appropriate for a given application.

In some embodiments, the dies 121, 123, 125 can be known good dies (KGD) determined by a testing or probing operation. The KGD is attached using a pick-and-place tool. A basic flip-chip (FC) packaging technology comprises an IC, an interconnect system, and a substrate. A function chip is connected to the substrate with a plurality of solder bumps, wherein the solder bumps forming a metallurgical interconnection between the chip and the substrate. The function chip, the solder bump, and the substrate form a flip-chip package.

In some embodiments, the packaged die 1011 and the first die structure 1012 can be combinatorial referred to as a memory chip layer due to the fact that the package die 1011 may be a NAND flash and the first die structure 1012 may include at least one DRAM. In other words, the memory chip layer includes a memory chip substantially equivalent to the one of the dies 121, 123, 125 and a memory package substantially equivalent to the packaged die 1011. The memory chip and the memory package are electrically connected through a solder 120.

The second layer 102 of the semiconductor package 10 includes another die structure 1022. Die structure 1022 includes a several dies 131, 133, 135 flip-chip bonded to the second RDL 1510. An active region 1022A of the die structure 1022 is connected to the die structure 1012 through a conductive plug 130. In some embodiments, the conductive plug 130 is a through insulator via (TIV). Second die structure 1022 broadly includes a plurality of dies 131, 133, 135, the electrical connection extending therefrom, and an inter-layer connection at the same level of the dies 131, 133, 135. As depicted in FIG. 1, the electrical connection includes conductive plug 13 or TIV disposed around the dies 131, 133, 135 of the same layer.

In some embodiments, the second layer 102 can be referred to as a silicon-on-chip (SOC) layer due to the fact that the second layer 102 can include at least one SOC die.

In some embodiments, die structure 1012 and die structure 1022 include different semiconductor chips or dies. For example, die structure 1012 may include a plain silicon wafer, a carrier, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Die structure 1022 can be a known good die (KGD), for example, which may have passed various electrical and/or structural tests. Die structure 1022 may be a semiconductor die and could be any type of integrated circuit, such as an application processor, logic circuitry, memory, analog circuit, digital circuit, mixed signal, and the like.

The semiconductor package 10 further includes a conductive array 103 electrically coupled to the die structure 1022 through the second RDL 1510. In some embodiments, the conductive array 103 includes ball grid array (BGA). BGA packaging technology generally is an advanced semiconductor packaging technology, which is characterized in that a semiconductor chip is mounted on a front surface of a substrate, and a plurality of conductive elements such as solder balls are arranged in a matrix array, customarily referred to as ball grid array, on a back surface of the substrate. The ball grid array allows the semiconductor package to be bonded and electrically connected to an external PCB or other electronic devices. As shown in FIG. 1, the conductive array 103 is coupled to an input/output of the second RDL 1510.

The first RDL 1310 between the first layer 101 and the second layer 102, as well as the second RDL 1510 between the conductive array 103 and the second layer 102 are formed according to the following description. A seed layer, such as a copper, titanium, or the like, is deposited on the molding compound of the second layer 102, such as by sputtering or another physical vapor deposition (PVD) process. A photo resist is deposited on the seed layer and patterned to expose portions of the seed layer by photolithography. The pattern is for a first metallization layer on the front side. Conductive material of the first metallization layer, such as copper, aluminum, the like, or a combination thereof, is deposited on the exposed seed layer, such as by electroless plating, electroplating, or the like. The photoresist is removed by an ash and/or flush process. The exposed seed layer removed, such as by a wet or dry etch. The remaining conductive material forms the first metallization layer, portions of which are electrically coupled to the conductive features underneath. A first inter-layer dielectric (ILD) is deposited over the first metallization layer. The first ILD layer may be a polyimide, polybenzoxazole (PBO), benzocyclobutene (BCB), the like, or a combination thereof. The first ILD layer can be deposited by a coating process, a lamination process, the like, or a combination thereof. Openings may be formed through the first ILD layer to the first metallization layer using acceptable photolithography techniques. Subsequent metallization layers and ILD layers, such as a second metallization layer and a second ILD layer, may be formed using the same or similar processes as discussed with regard to the first metallization layer and the first ILD layer. Conductive material deposited during the formation of a subsequent metallization layer may be deposited in openings of the previously formed ILD layer to electrically couple respective metallization layers. After forming the topmost ILD layer, the second ILD layer in this embodiment, openings are formed through the topmost front side ILD layer for connectors coupled between the topmost front side metallization layer, such as the second metallization layer, and another package, another die, and/or another substrate. It should be noted that any number of metallization layers and ILD layers may be formed, and the use of two in this embodiment is used as an example.

Furthermore, an underfill 127 is applied between the dies 121, 123, 125 and the substrate having first RDL 1310. Similarly, an underfill 137 is applied between the dies 131, 133, 135 and the substrate having second RDL 1510. An underfill material such as liquid epoxy, deformable gel, silicon rubber, the like, or a combination thereof, is dispensed and cured between the dies 121, 123, 125, 131, 133, 135, and the corresponding substrates. Alternatively, no underfill may be applied between the aforesaid dies and the corresponding substrates.

Due to the flip-chip bonded technique, dies 121, 123, 125, 131, 133, 135 can have different thicknesses and possess different types of functions according to package design.

In some embodiments, the dies 121, 123, 125 of the first layer 1012 may include different type of function dies. For example, dies 121 and 123 are memory die having a thickness of about 3 mils, is attached through the opening to conductive features in the first RDL 1310, such as by controlled collapse chip connection (C4) bumps. For another example, die 125 is an integrated passive device (IPD) such as a capacitor or an inductor, attached using an acceptable pick-and-place tool and reflowing connectors between the die 125 and the first RDL 1310. Accordingly, the connectors may be a bump on trace (BOT). Die 125 may have a thickness smaller than 3 mils. Detailed connection between the dies 121, 123, 125 and the first RDL 1310 is further discussed from FIG. 4A to FIG. 6B.

In some embodiments, the dies 131, 133, 135 of the second layer 102 may include different type of function dies. For example, die 133 is a logic circuitry die or a silicon-on-chip (SOC) die having a thickness of about 3 mils being attached through the opening to conductive features in the second RDL 1510, such as by controlled collapse chip connection (C4) bumps. For another example, dies 131, 135 are integrated passive devices (IPD) such as a capacitor or an inductor, attached using an acceptable pick-and-place tool and reflowing connectors between the dies 131, 135 and the second RDL 1510. Accordingly, the connectors may be a bump on trace (BOT). Dies 131, 135 may have thicknesses smaller than 3 mils. Detailed connection between the dies 131, 133, 135 and the second RDL 1510 is further discussed from FIG. 4A to FIG. 6B.

Furthermore, as shown in FIG. 1, a die 141 is positioned at the same level of the conductive array 103. For example, the die 141 is an IPD with the conductive trace connected to the second RDL 1510. In some embodiments, the die 141 is further attached to the substrate of the second layer 102 through underfill 147. As in FIG. 1, die 141 is mounted at the same level of the conductive array 103, that is, at the same side of the substrate or carrier of the second layer 102.

Figure 2:
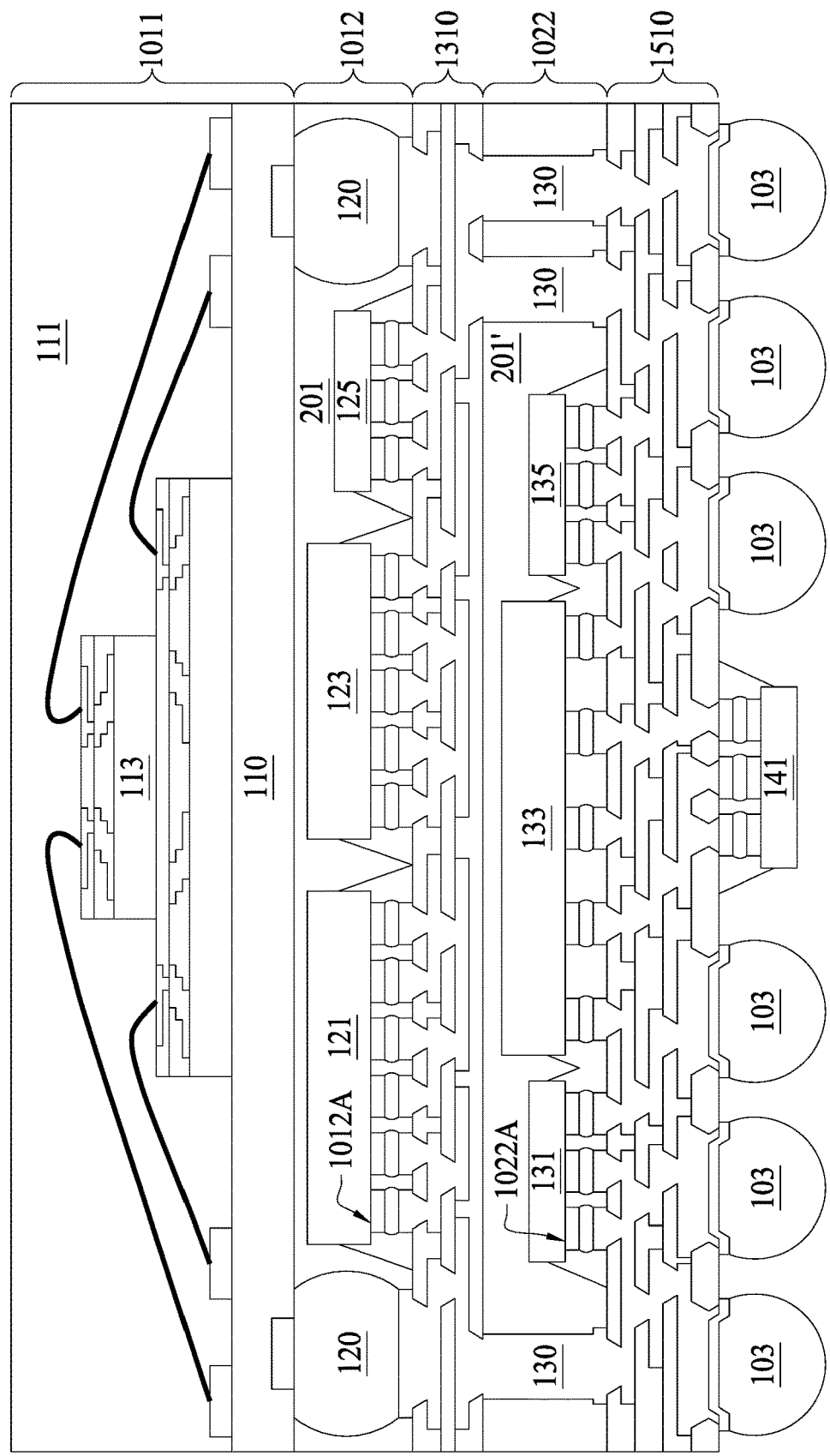
FIG. 2 is a cross sectional view of a semiconductor package, in accordance with some embodiments of the present disclosure.

Referring to FIG. 2, FIG. 2 is a cross sectional view of a semiconductor package 20, in accordance with some embodiments of the present disclosure. Identical numeral annotations represent identical or similar elements and would not be repeated herein for brevity. The difference between semiconductor package 20 and semiconductor package 10 lies in that, in addition to the second die structure 1022, the first die structure 1012 is also molded with molding compound 201. As shown in FIG. 2, the molding compound 201' of the second die structure 1022 can have a CTE different from the molding compound 201 of the first die structure 1012. Optionally, with the molding compound 201, the underfill 1012A for the first die structure 1012 can be removed. Similarly, with the molding compound 201', the underfill 1022A for the second die structure 1022 can be removed. In some embodiments, the semiconductor package 20 is free of underfill 1012A, 1022A.

Figure 3:
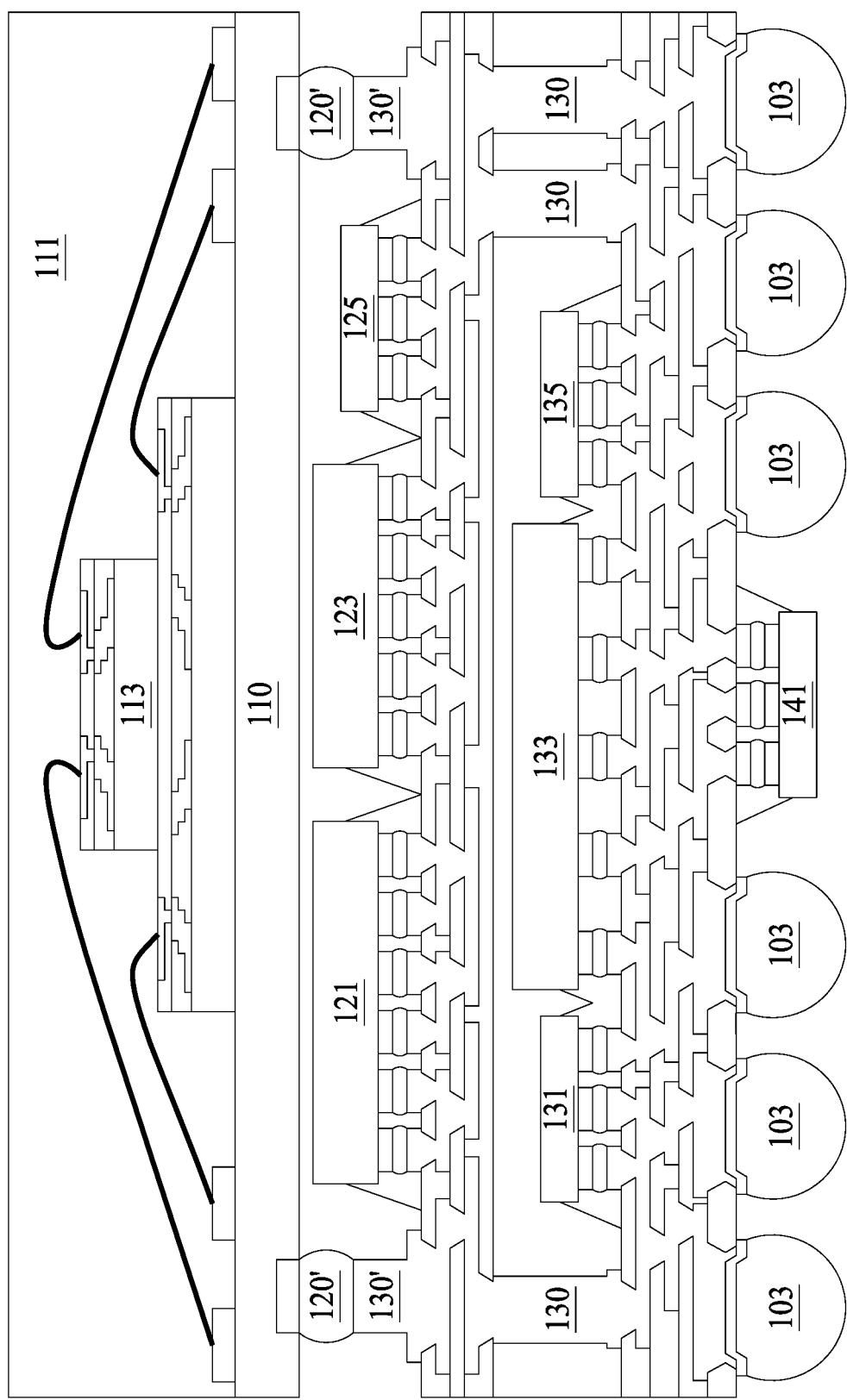
FIG. 3 is a cross sectional view of a semiconductor package, in accordance with some embodiments of the present disclosure.

Referring to FIG. 3, FIG. 3 is a cross sectional view of a semiconductor package 30, in accordance with some embodiments of the present disclosure. Identical numeral annotations represent identical or similar elements and would not be repeated herein for brevity. The difference between semiconductor package 30 and semiconductor package 10 lies in that, the first die structure 1012 is electrically connected to the packaged die 1011 through a solder 120' and a conductive bump 130'. Note the conductive bump 130' of semiconductor package 30 possesses a smaller height than the conductive bump 130 of the semiconductor package 10. The solder 120' of the semiconductor package 30 possesses a smaller height than the solder 120 of the semiconductor package 10. The size of solder 120, 120' connecting the first die structure 1012 and the packaged die 1011 is allowed to be adjusted according to the critical dimension of the semiconductor package.

For example, if the packaged die 1011 possesses a 150 µm pitch, a 80 µm-radius solder ball 120' shall be adopted as shown in FIG. 3. However, under the condition that the thicknesses of the dies 121, 123, 125 are predetermined, the 80 µm-radius solder ball 120' may not be sufficient for the interlayer separation. A conductive bump 130' can be implemented to compensate the interlayer separation by gapping the first RDL 1310 and the 80 µm-radius solder ball 120'. Hence, the height of conductive bump 130' is subsequently determined after knowing the pitch of the packaged die 1011 and the radius of the solder ball 120'. On the other hand, if the packaged die 1011 possesses a 300 µm pitch, a 180 µm-radius solder ball 120 shall be adopted as shown in FIG. 1. No additional conductive bump is necessary under the aforesaid scenario. In some embodiments, the conductive bump 130' occupies more than half of the interlayer separation.

As shown in FIG. 3, the first die structure 1012 is not molded. In other words, a backside of the dies 121, 123, 125, the solder 120', and the conductive bump 130' are all exposed to ambient.

Figure 4A:
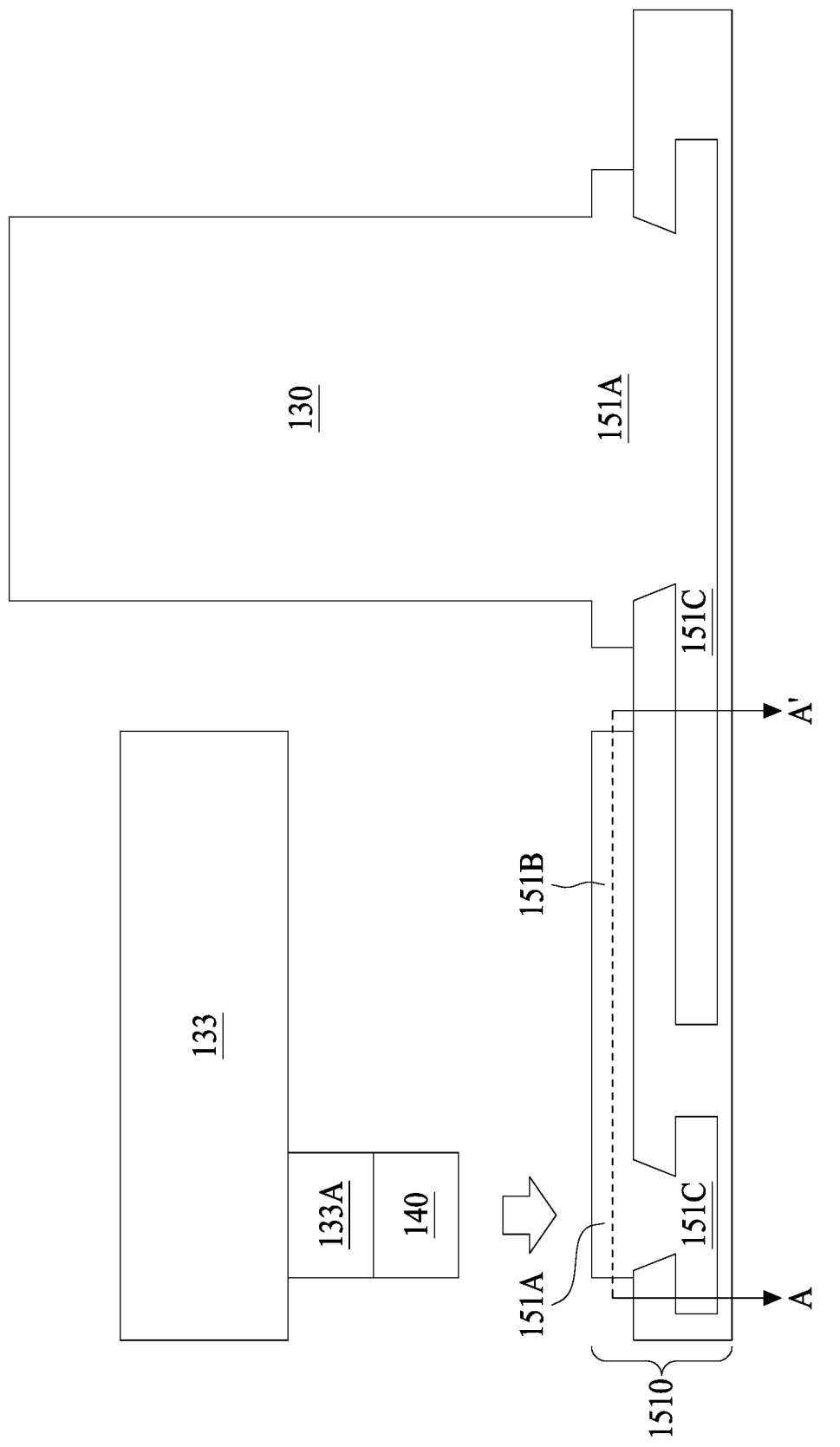
FIG. 4A and FIG. 4B show a portional enlarged cross sectional views of a semiconductor package, in accordance with some embodiments of the present disclosure.
Figure 4B:
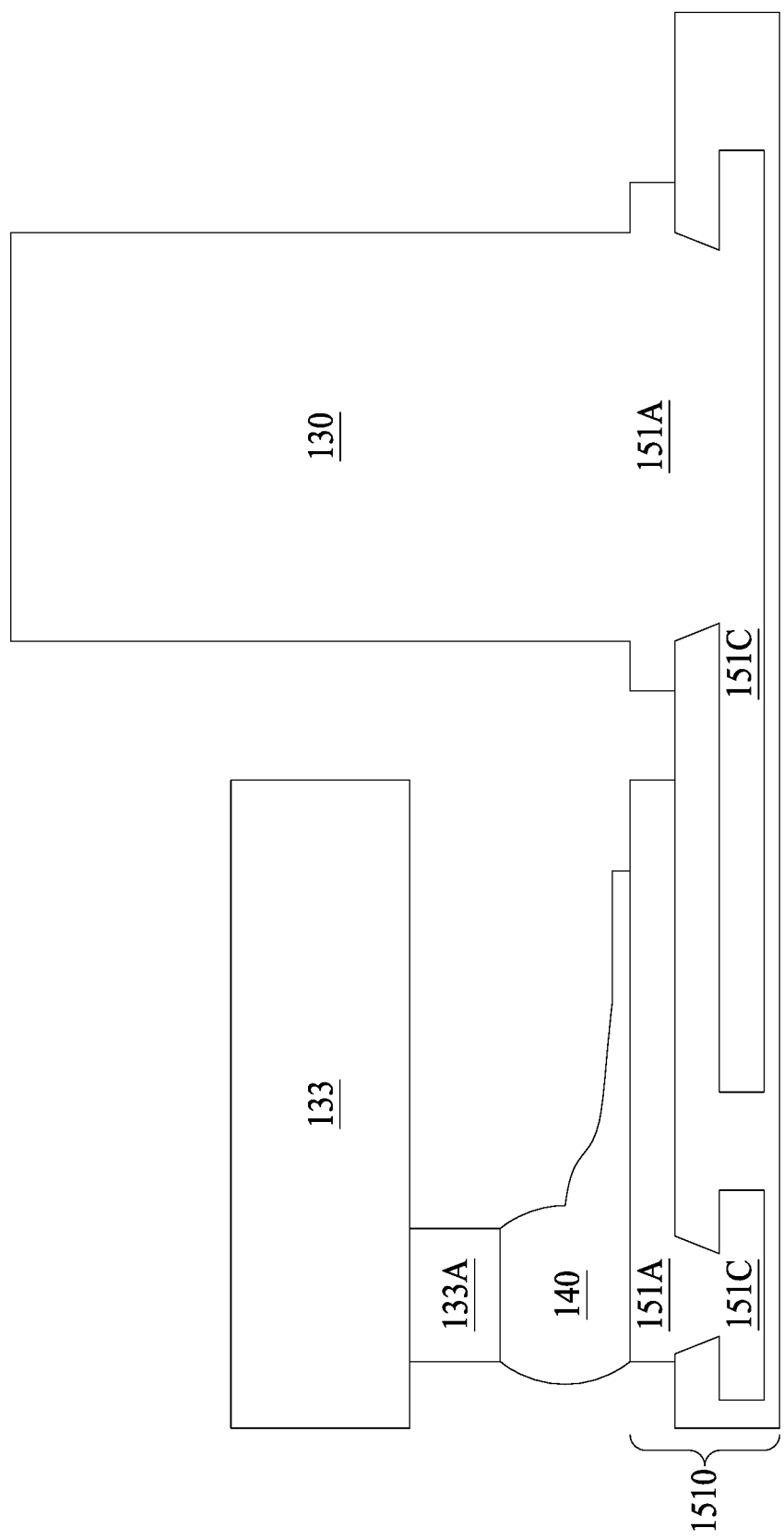

FIG. 4A and FIG. 4B show a portional enlarged cross sectional views of a semiconductor package, in accordance with some embodiments of the present disclosure. FIG. 4A and FIG. 4B depict an enlarged view of a microbump connection between one of the dies 131, 133, 135 of the second die structure 1022 and the second RDL 1510. As shown in FIG. 4A, a microbump 133A is illustrated on an active surface of the die 133. A layer of tin 140 or the like are disposed over the microbump 133A. Separately, the second RDL 1510 further includes a conductive line 151C, a microbump receiver or an under bump metallization (UBM) 151A coupled to the conductive line 151C, and a ground mesh 151B connected to the UBM. A conductive bump 130 is formed over the UBM 151A. Note the layer of tin 140 is only applied to the microbump 133A for testing purpose instead of over the UBM 151A and the ground mesh 151B due to the fact that an additional layer of tin would prevent the conductive plug 130 from being plated to the UBM 151A of the second RDL 1510. In some embodiments, the ground mesh 151B connects some of the adjacent UBMs according to different layout designs. In other words, some UBMs are not connected to the ground mesh 151B. A top view of line AA' is subsequently discussed in FIG. 7 of the present disclosure. The arrow in FIG. 4A indicates the die 133 is to be soldered to the second RDL 1510 through UBM 151A.

After soldering operation is completed, as shown in FIG. 4B, the UBM 151A under the conductive bump 130 is not connected with the UBM 151A under the microbump 133A of the die 133. In FIG. 4B, after reflow, the layer of tin 140 may be wetted over the UBM 151A and extending to the ground mesh 151B. To prevent excessive extension of the tin 140, a necking portion joining the UBM 151A and the ground mesh 151B is designed to constrain the extent of solder wetting.

FIG. 5A and FIG. 5B show a portional enlarged cross sectional views of a semiconductor package, in accordance with some embodiments of the present disclosure. FIG. 5A and FIG. 5B depict an enlarged view of a microbump connection between one of the dies 121, 123, 125 of the first die structure 1012 and the first RDL 1310. As shown in FIG. 5A, a microbump 123A is illustrated on an active surface of the die 123. A layer of tin 140 or the like is disposed over the microbump 123A. Separately, the first RDL 1310 further includes a conductive line 131C and a microbump receiver or an under bump metallization (UBM) 131A coupled to the conductive line 131C. A conductive bump 130' is formed over the UBM 131A. The arrow in FIG. 5A indicates the die 123 is to be soldered to the first RDL 1310 through UBM 131A. The dotted line surrounding the solder 120' in FIG. 5A indicates that the solder 120' is not disposed over the conductive bump 130' when the die 123 being attached to the first RDL 1310. A solder ball is mounted on the packaged die 1011 shown in FIG. 5B and then the packaged die 1011 being attached to the first RDL 1310 via solder 120' and conductive bump 130', as shown in FIG. 5B.

After soldering operation is completed, as shown in FIG. 5B, the UBM 131A is connected to the conductive bump 130', and a packaged die 1011 is further attached to the solder 120'. Die 123 is connected to the first RDL 1310 through microbump 123A, solder 140, and UBM 131A.

Figure 6A:
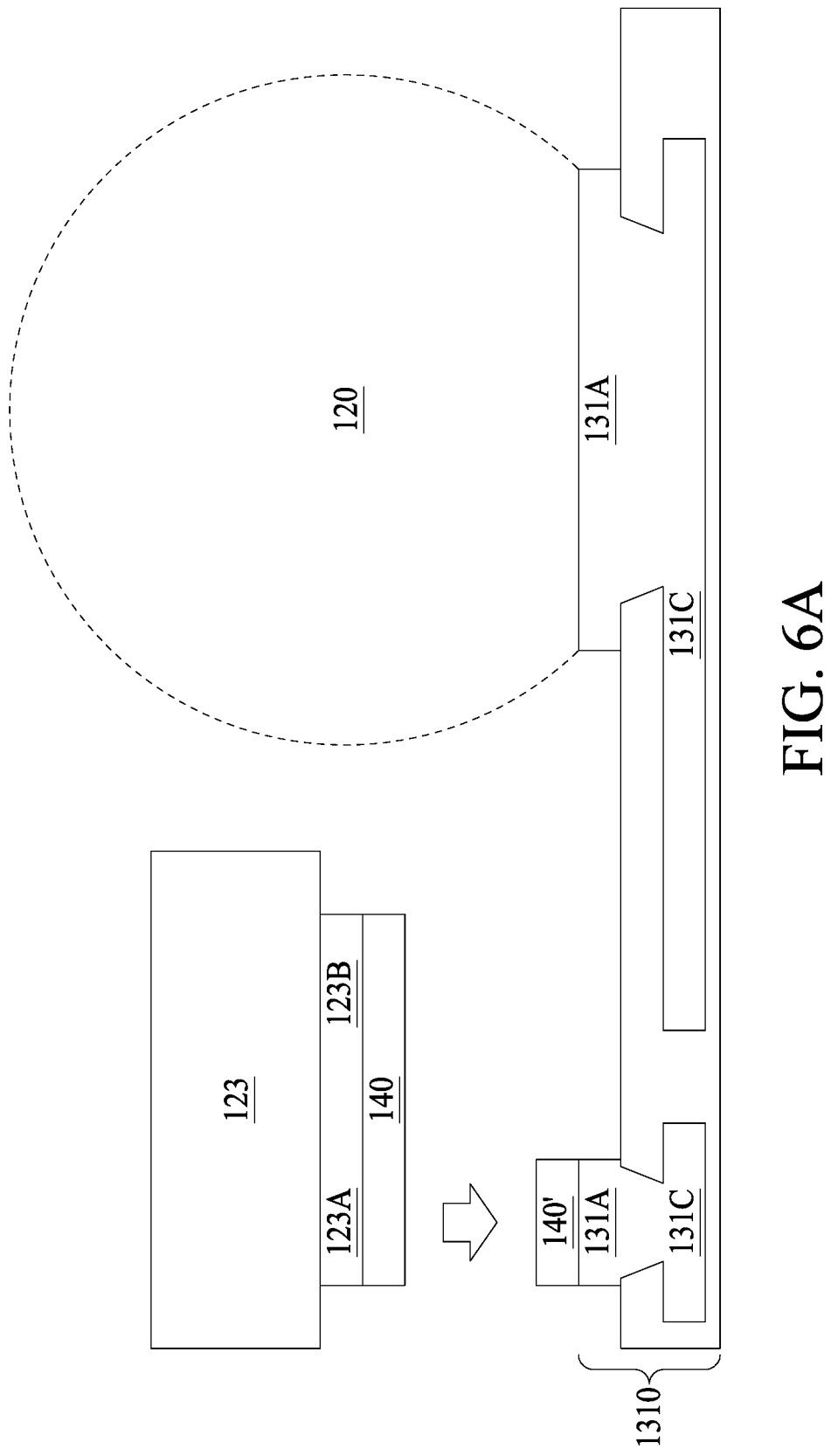
FIG. 6A and FIG. 6B show a portional enlarged cross sectional views of a semiconductor package, in accordance with some embodiments of the present disclosure.
Figure 6B:
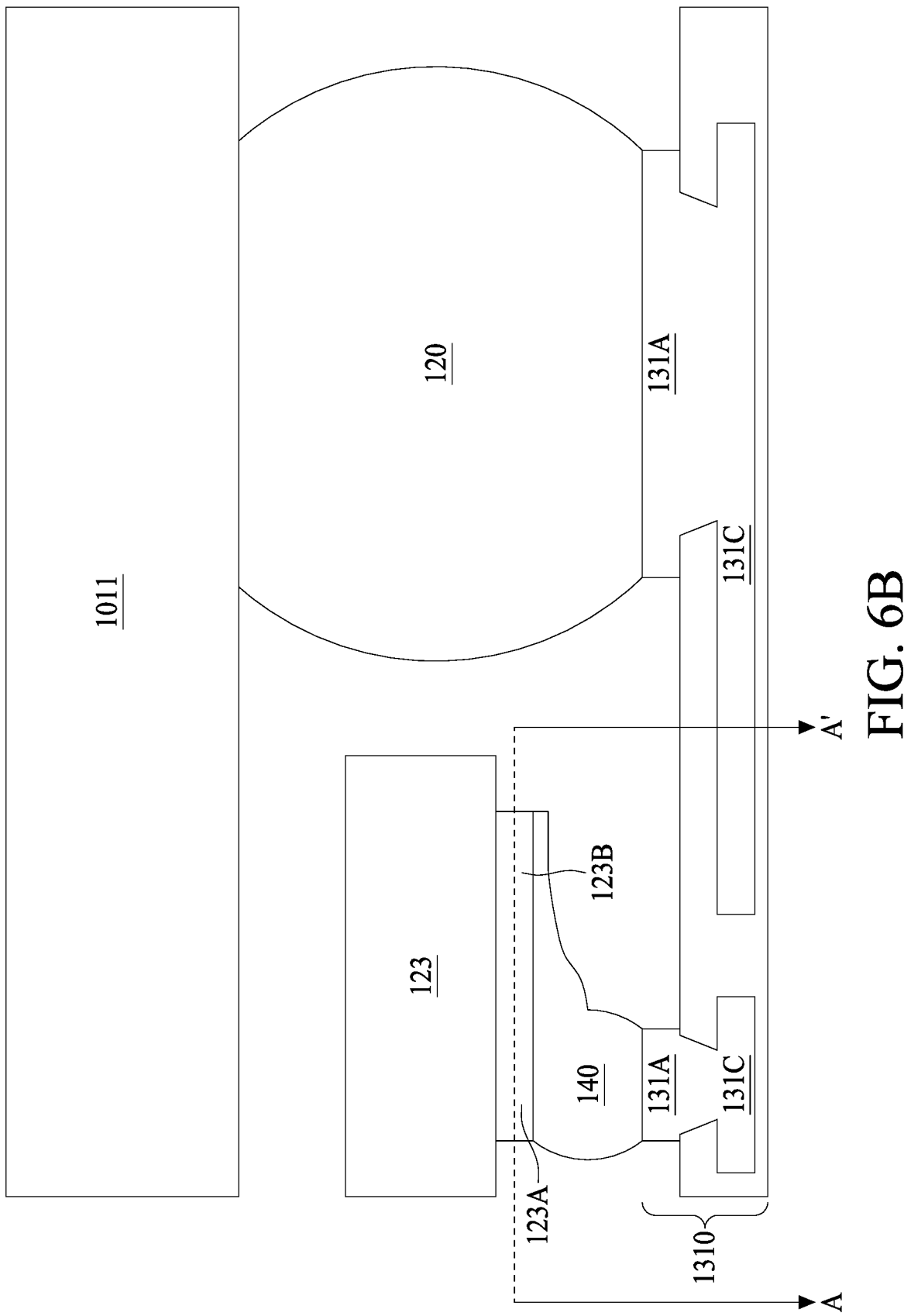

FIG. 6A and FIG. 6B show a portional enlarged cross sectional view of a semiconductor package, in accordance with some embodiments of the present disclosure. FIG. 6A and FIG. 6B depict an enlarged view of a microbump connection between one of the dies 121, 123, 125 of the first die structure 1012 and the first RDL 1310. As shown in FIG. 6A, a microbump 123A and a ground mesh 123B connected to the microbump 123A are illustrated on an active surface of the die 123. A layer of tin 140 or the like are disposed over the microbump 123A. Separately, the first RDL 1310 further includes a conductive line 131C and a microbump receiver or an under bump metallization (UBM) 131A coupled to the conductive line 131C. A solder ball 120 is formed over the UBM 131A. Note the layer of tin 140 is not only applied to the microbump 123A and the ground mesh 123B but also over the UBM 131A due to the fact that no conductive plug is required to be plated over the UBM 131A in the present embodiment. A top view of line AA' in FIG. 6B is subsequently discussed in FIG. 7 of the present disclosure. The arrow in FIG. 6A indicates the die 123 is to be soldered to the first RDL 1310 through UBM 131A. The dotted line surrounding the solder 120 in FIG. 6A indicates that the solder 120 is not disposed over the UBM 131A when the die 123 being attached to the first RDL 1310. A solder ball is mounted on the packaged die 1011 shown in FIG. 6B and then the packaged die 1011 being attached to the first RDL 1310 via solder 120, as shown in FIG. 6B.

After soldering operation is completed, as shown in FIG. 6B, the UBM 131A under the conductive bump 130 is not connected with the UBM 151A under the microbump 133A of the die 133. In FIG. 4B, after reflow, the layer of tin 140 may be wetted over the UBM 151A and extending to the ground mesh 151B. To prevent excessive extension of the tin 140, a necking portion joining the UBM 151A and the ground mesh 151B is designed to constrain the extent of solder wetting.

Figure 7:
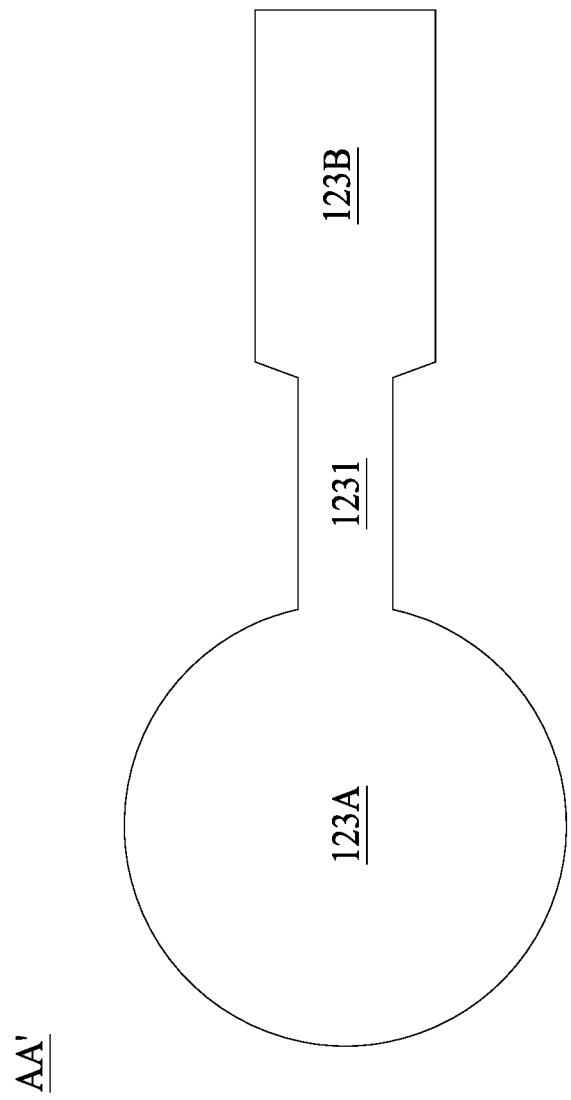
FIG. 7 shows a top view of a junction of a conductive bump and grounded mesh lines, in accordance with some embodiments of the present disclosure.

FIG. 7 shows a top view of a junction of a conductive bump and grounded mesh lines, in accordance with some embodiments of the present disclosure. Referring back to FIG. 6B, the conductive bump 123A and the ground mesh 123B on the die 123 are depicted in a top view perspective. The conductive bump 123A and the ground mesh 123B are connected through a necking portion 1231. The necking portion 1231 has a width substantially narrower than a width of the ground mesh 123B. The necking portion 1231 is so designed as to prevent the solder ball being extensively wetted toward the ground mesh 123B. Similarly, a conductive bump 123A can be connected to more than one ground mesh 123B. Each junction thereof can include a necking portion 1231 as depicted in FIG. 7.

In some embodiment, the similar necking portion 1231 can be implemented at the junction of the UBM 151A and the ground mesh 151B of the second RDL 1510, as previously discussed in FIG. 4A.

Figure 8A:
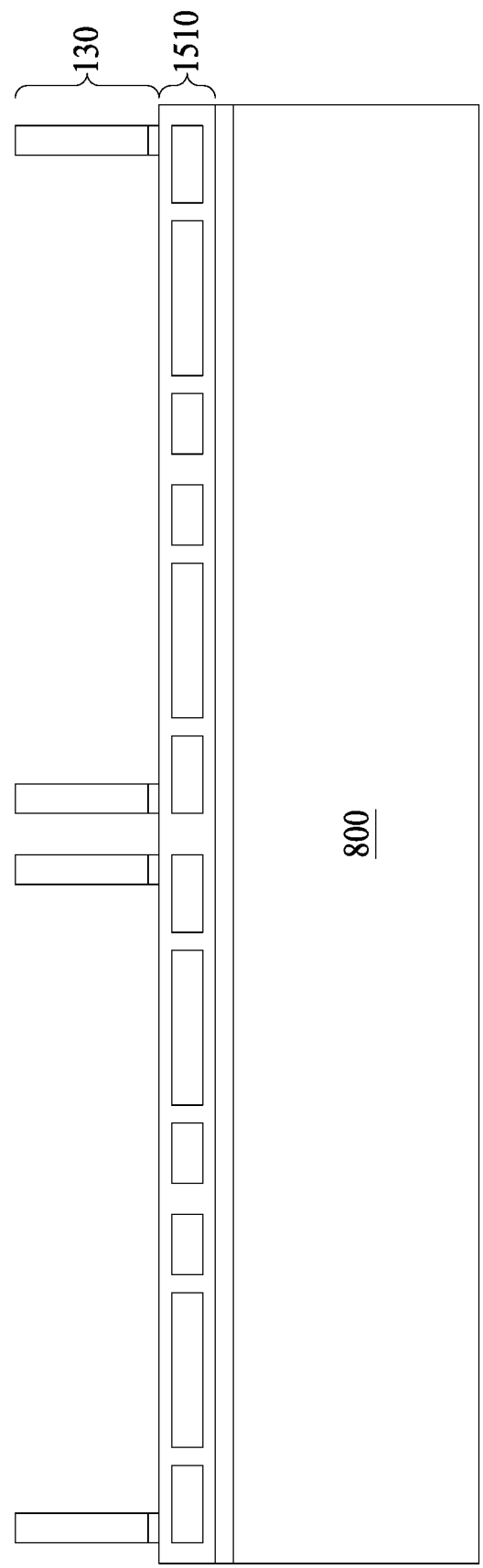
FIG. 8A to FIG. 8J show cross sectional views of a sequence of a method for manufacturing a semiconductor package, in accordance with some embodiments of the present disclosure.

FIG. 8A to FIG. 8J show cross sectional views of a sequence of a method for manufacturing a semiconductor package 10, in accordance with some embodiments of the present disclosure. Referring back to figures preceding FIG. 8A, identical numeral annotations represent identical or similar elements and would not be repeated herein for brevity. In FIG. 8A, a bottom RDL 1510, or the RDL in contact with the glass carrier 800, is formed over a glass carrier 800. RDL formation is previously discussed and can be referred thereto. Subsequently, a through insulator via (TIV) 130 is formed over the bottom RDL 1510 by, for example, an electroplating operation. TIV 130 is electrically connected to the bottom RDL 1510. A photoresist (not shown) is deposited and patterned over the conductive trace of the bottom RDL 1510 such as by acceptable photolithography techniques. A seed layer is deposited in the openings of patterned photoresist. The seed layer can be copper, titanium, the like, or a combination thereof, and can be deposited by sputtering, another PVD process, the like, or a combination thereof. A conductive material, such as copper, aluminum, the like, or a combination thereof, is deposited in the openings by electroless plating, electroplating, or the like. The photoresist is removed, such as by an ash and/or flush process. TIV 130 remain along with any further metallization pattern.

Figure 8B:
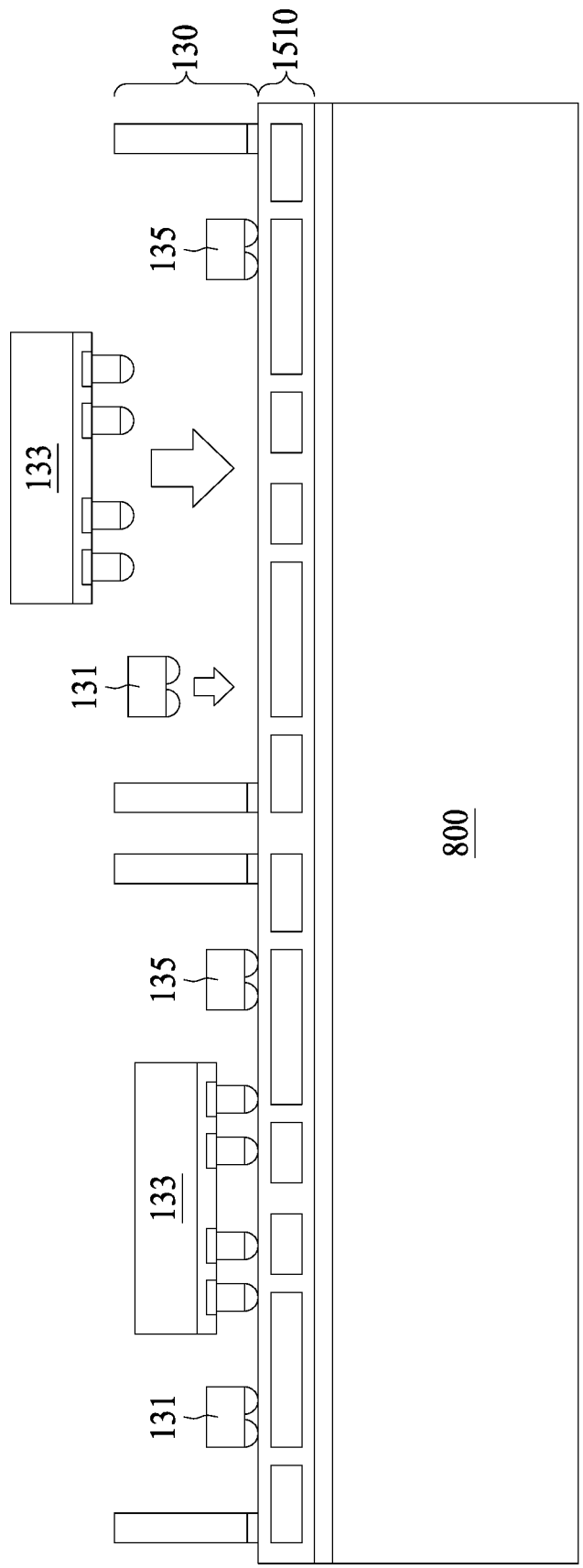
Figure 8C:
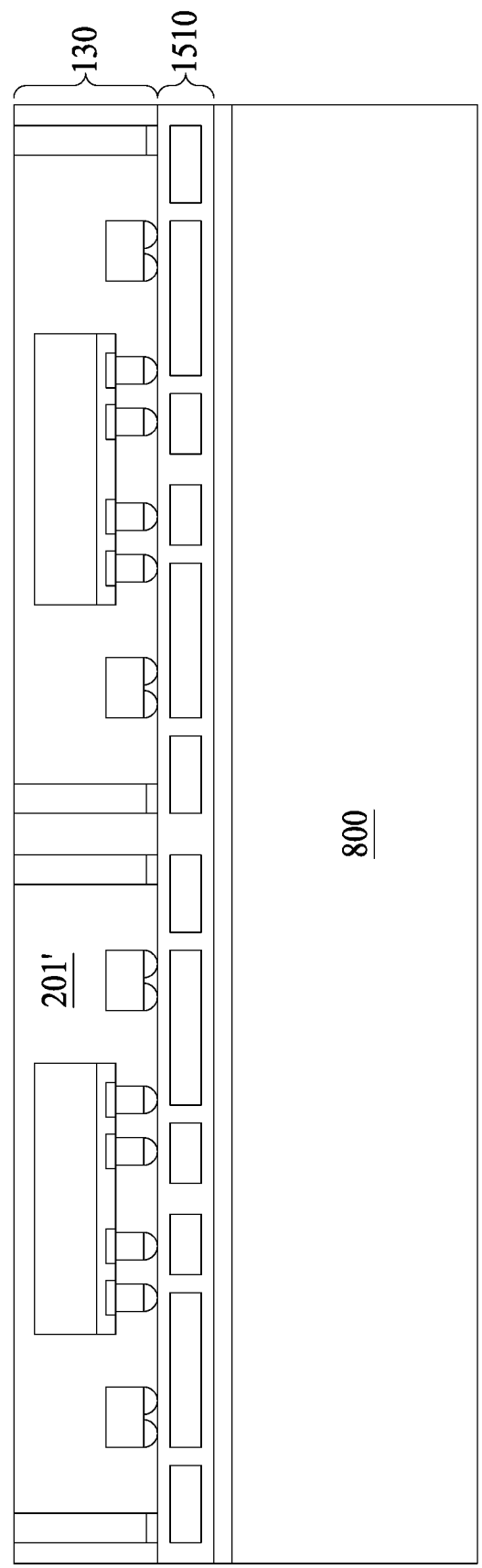

In FIG. 8B, a bottom die structure is flip-chip bonded to the bottom RDL 1510 and thus surrounded by previously formed TIVs 130. The bottom die structure may include several dies 131, 133, 135 having different thickness and different functions. Dies 131, 133, 135 for the bottom die structure can be a pick-and-place KGD. In FIG. 8C, a molding compound 201' is applied to mold the bottom die structure and the TIVs 130. A planarization operation is followed to at least expose a top surface of the TIV 130 in order to expose the metallization portion for subsequent operations. In some embodiments, a back surface of any of the dies 131,133, 135 is not exposed from the molding compound 201' for the sake of avoiding copper contamination over the silicon substrate. Alternatively, while not illustrated in FIG. 8C, a back surface of any of the dies 131,133, 135 is exposed from the molding compound 201'.

Figure 8D:
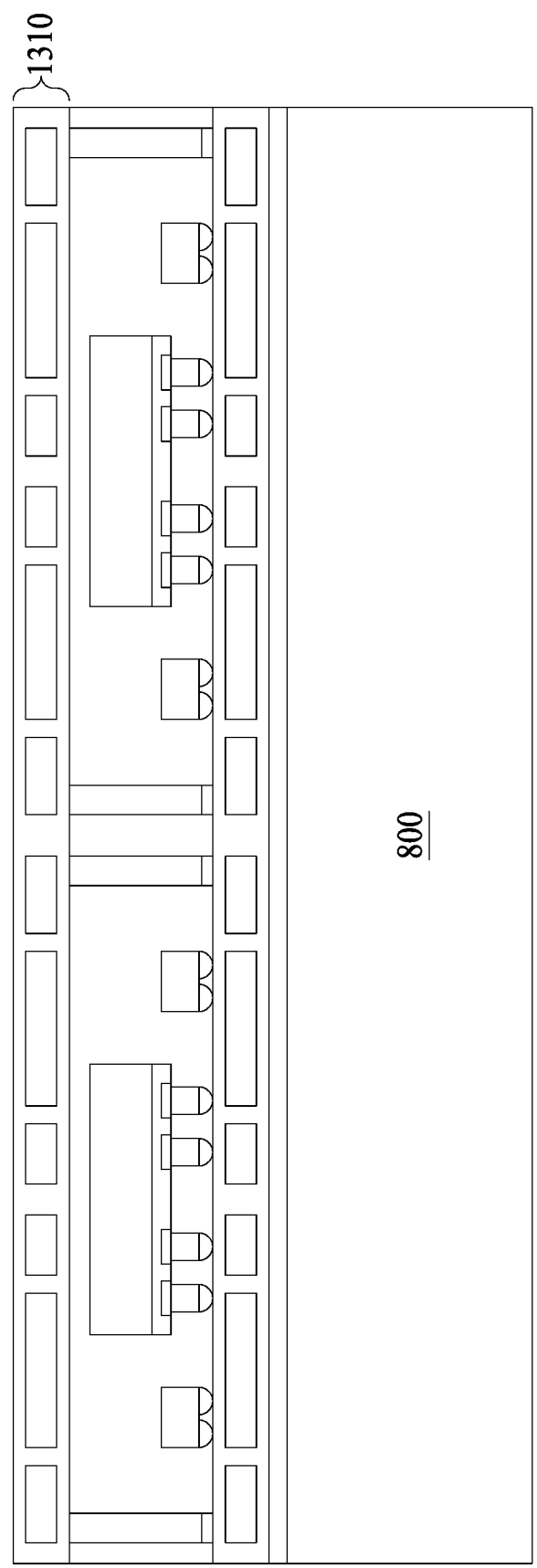
Figure 8E:
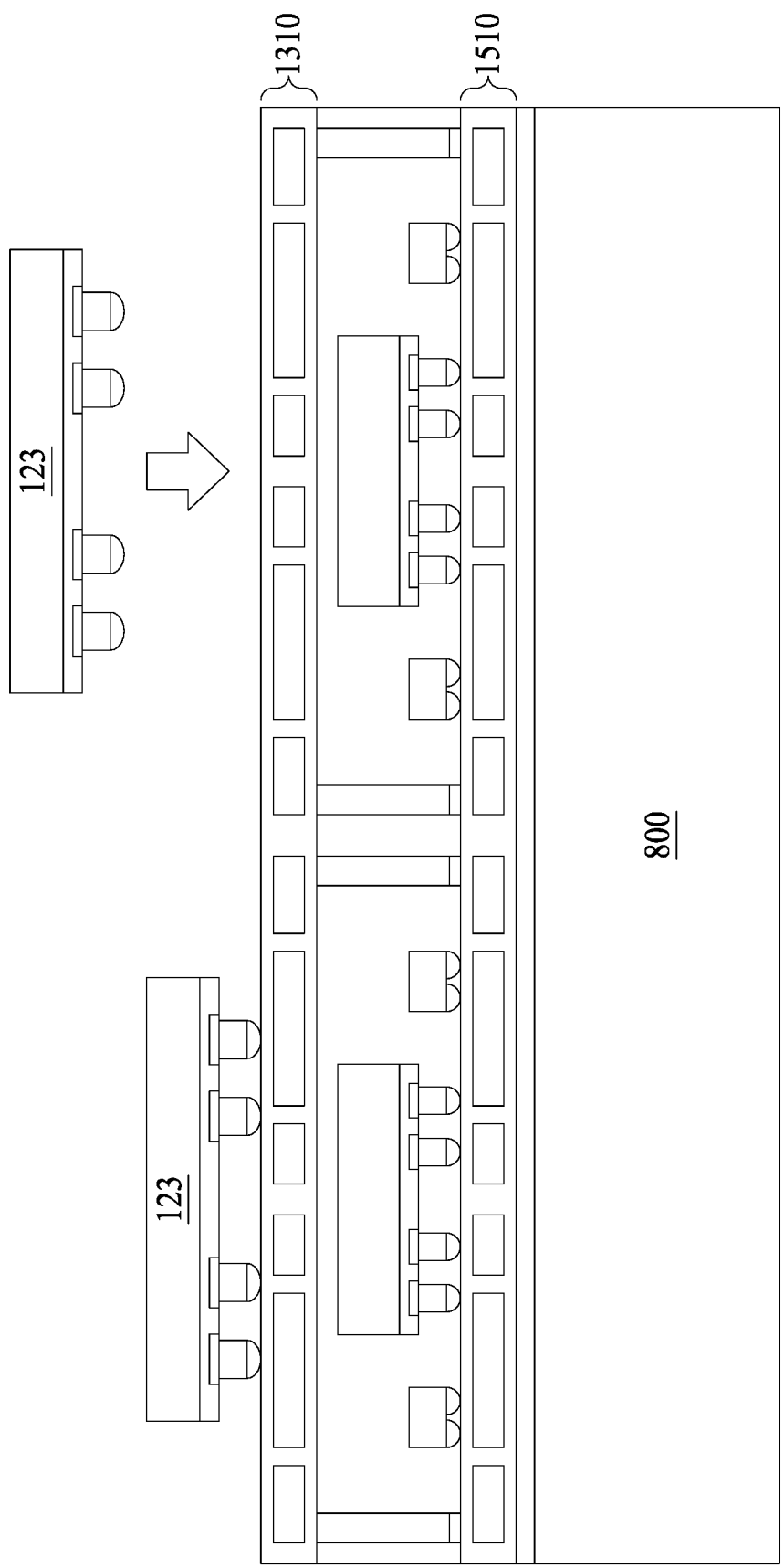
Figure 8F:
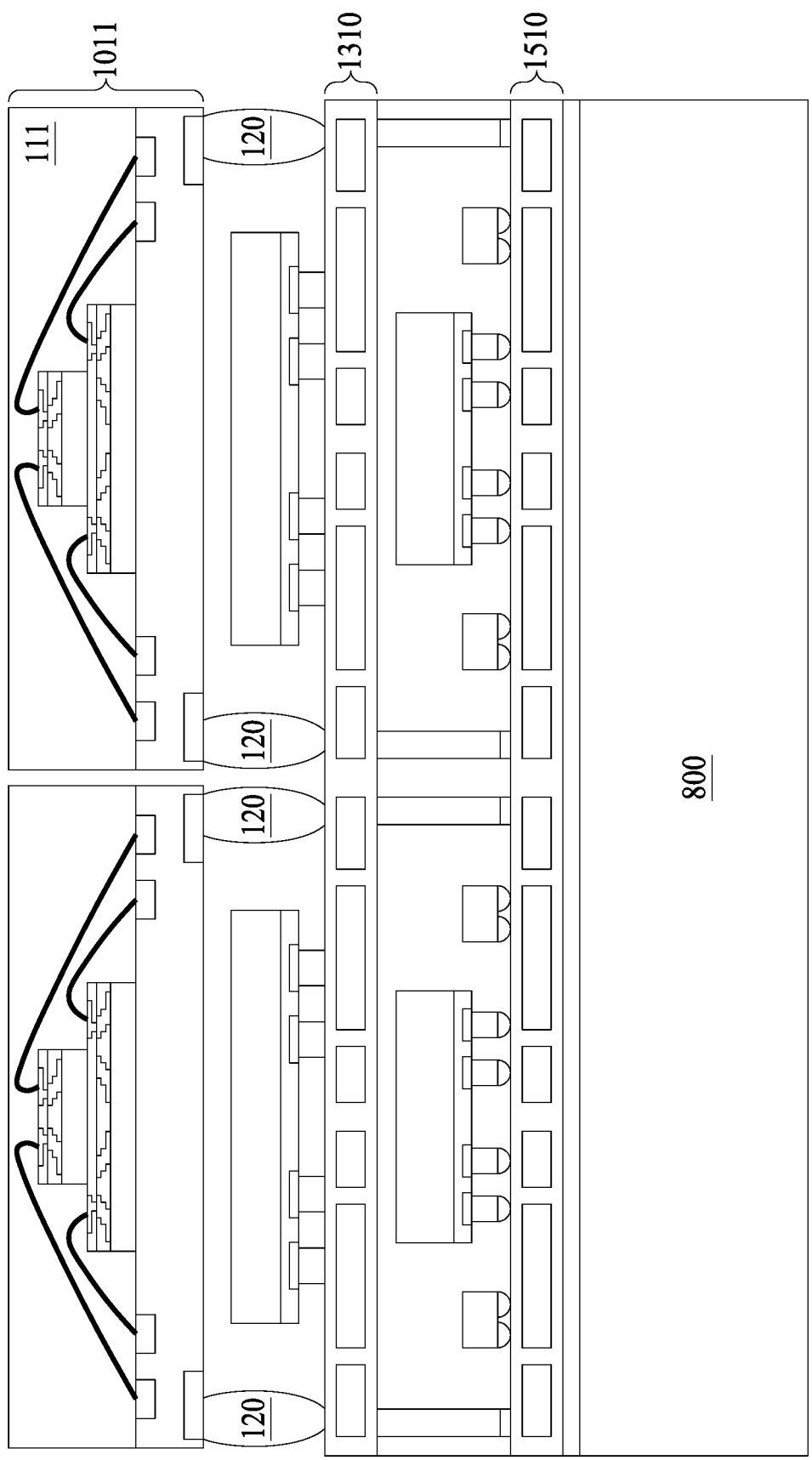
Figure 8G:
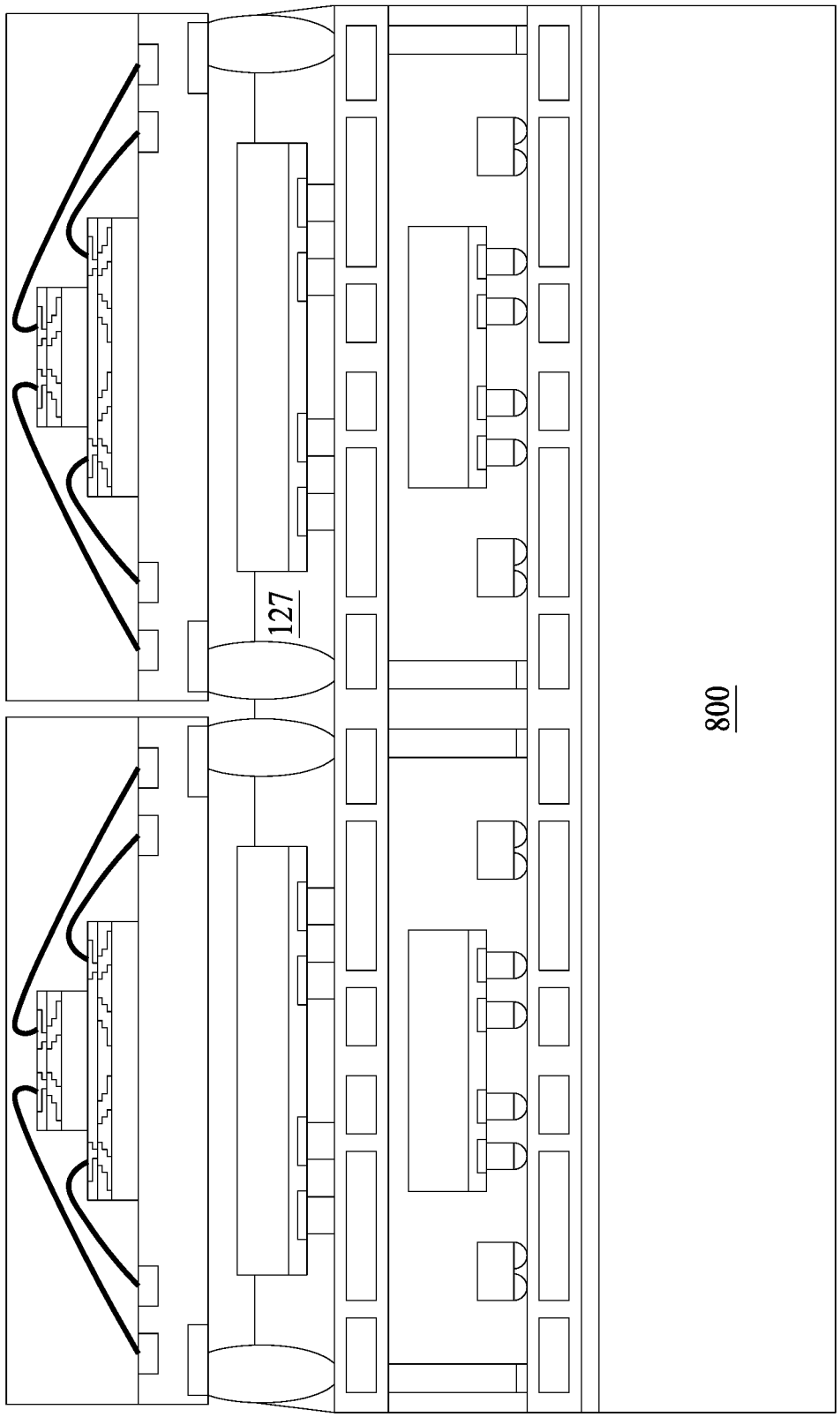

In FIG. 8D, an upper RDL 1310 is formed over the planarized surface of the molding compound 201' and being electrically connected to the bottom die structure through TIV 130. In FIG. 8E, an upper die structure is flip-chip bonded to the upper RDL 1310. The upper die structure may include at least one die 123 or several dies having different thicknesses and functions. Dies for the upper die structure can be a pick-and-place KGD. Underfill can be applied after mounting the die 123, or alternatively, after bonding the packaged die 1011 as illustrated in FIG. 8G. In FIG. 8F, a packaged die 1011 is prepared and bonded to the upper RDL 1310 though a soldering operation. Note a packaged die 1011 includes placing solder balls at the carrier 110 side of the package. The size of the solder ball is determined by accounting the thickness of the upper die structure and the critical dimension or the pitch of the packaged die 1011. A smaller solder ball may be adopted to be placed at the carrier 110 side of the packaged die 1011 if critical dimension or pitch of the packaged die 1011 is small. A solder connection can be viewed between the carrier 110 side of the packaged die 1011 and an exposed metallization of the upper RDL 1310. Note through carrier 110 metallization (not shown) allows a conductive path from the solder 120 to the stacked die positioned at the other side of the carrier 110 and being surrounded by molding compound 111.

Figure 8H:
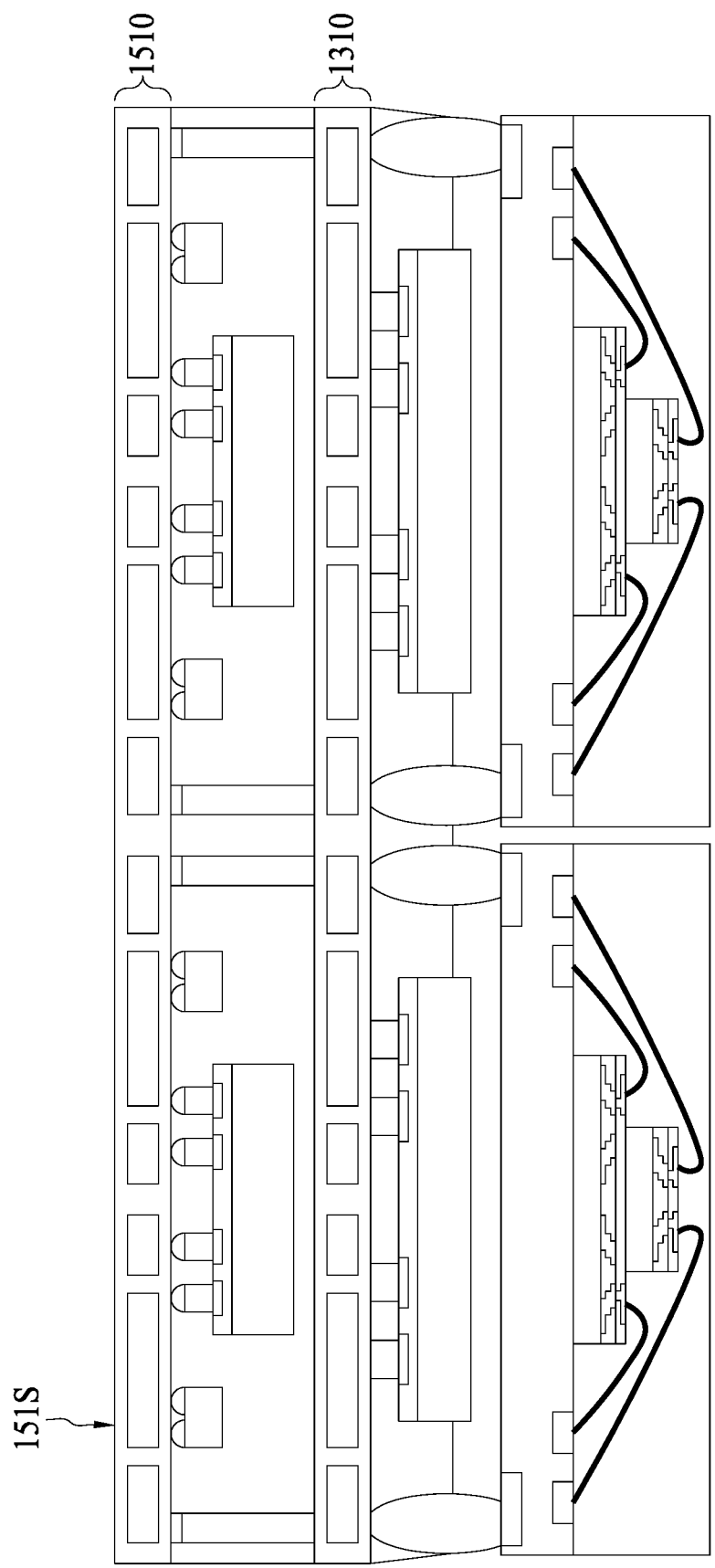
Figure 8I:
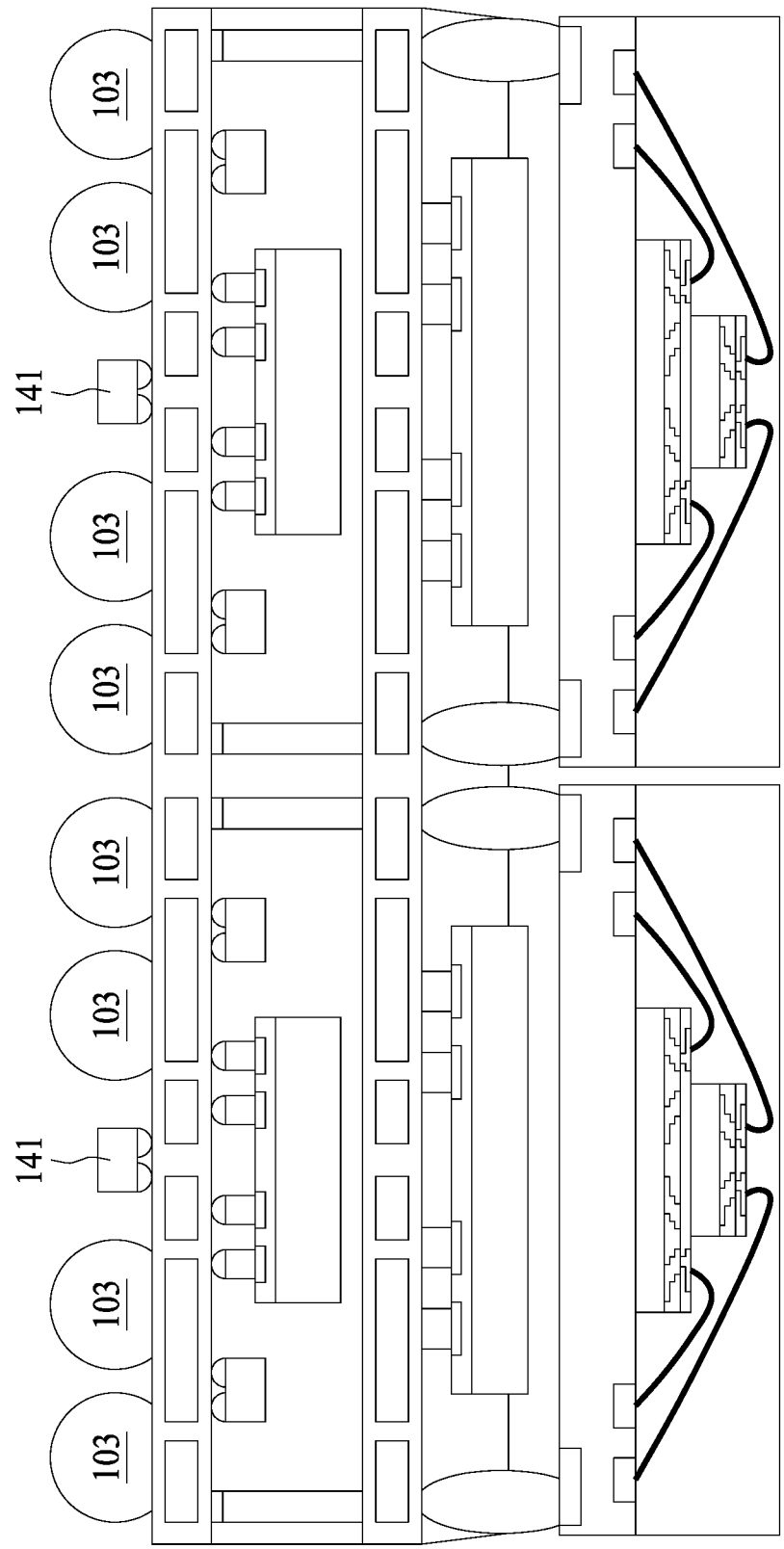
Figure 8J:
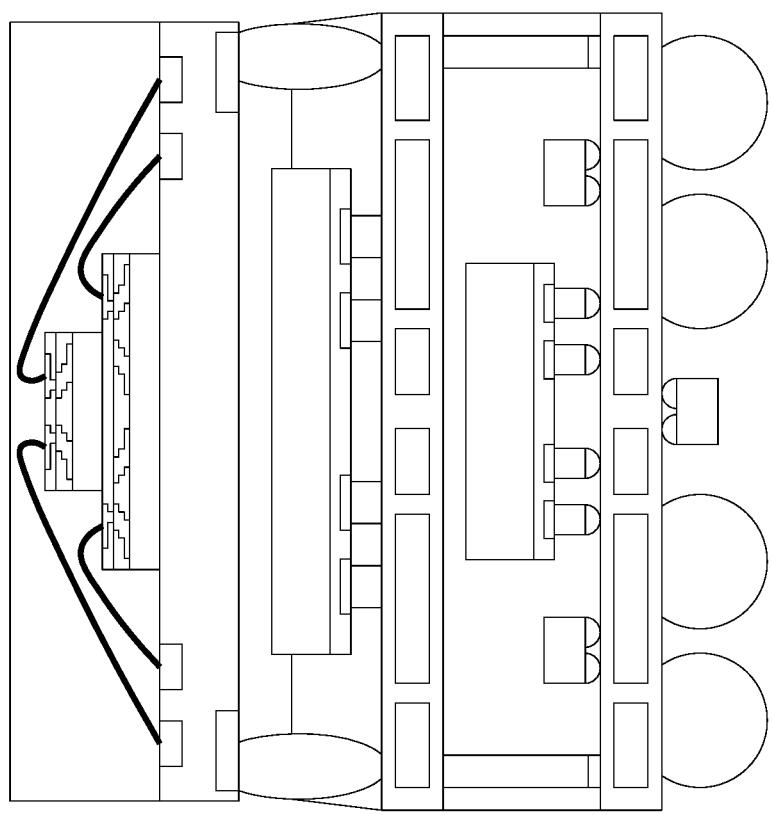

In FIG. 8G, an underfill 127 is applied to strengthen the bonding between the die 123, the solder 120, and the upper RDL 1310. Referring to FIG. 8H, glass carrier 800 is debonded from the bottom RDL 1510 and exposing a side 151S of the bottom RDL 1510 away from the bottom die structure. A photolithography operation is adopted to expose metallization or conductive contact at the side 151S of the bottom RDL 1510 from the dielectric layers surrounding the metallization. The photolithography operation includes an etch back operation. The de-bonding may comprise exposing an adhesive between the bottom RDL 1510 and glass carrier 800 to UV lights, such as a laser, or by exposing the adhesive to a solvent. The glass carrier 800 may comprise, for example, glass, silicon oxide, aluminum oxide, a combination thereof. The adhesive may be any suitable adhesive, such as UV glue, which loses its adhesive property when exposed to UV lights. Further in FIG. 8I, solder balls 103 are disposed over the metallization at the side 1515 of the bottom RDL 1510, forming an external conductive layer. Note a further die 141 can be mounted over the side 151S of the bottom RDL 1510 at the same level with the solder balls 103. In FIG. 8J, further singulation of the semiconductor package is conducted by die sawing.

Figure 9A:
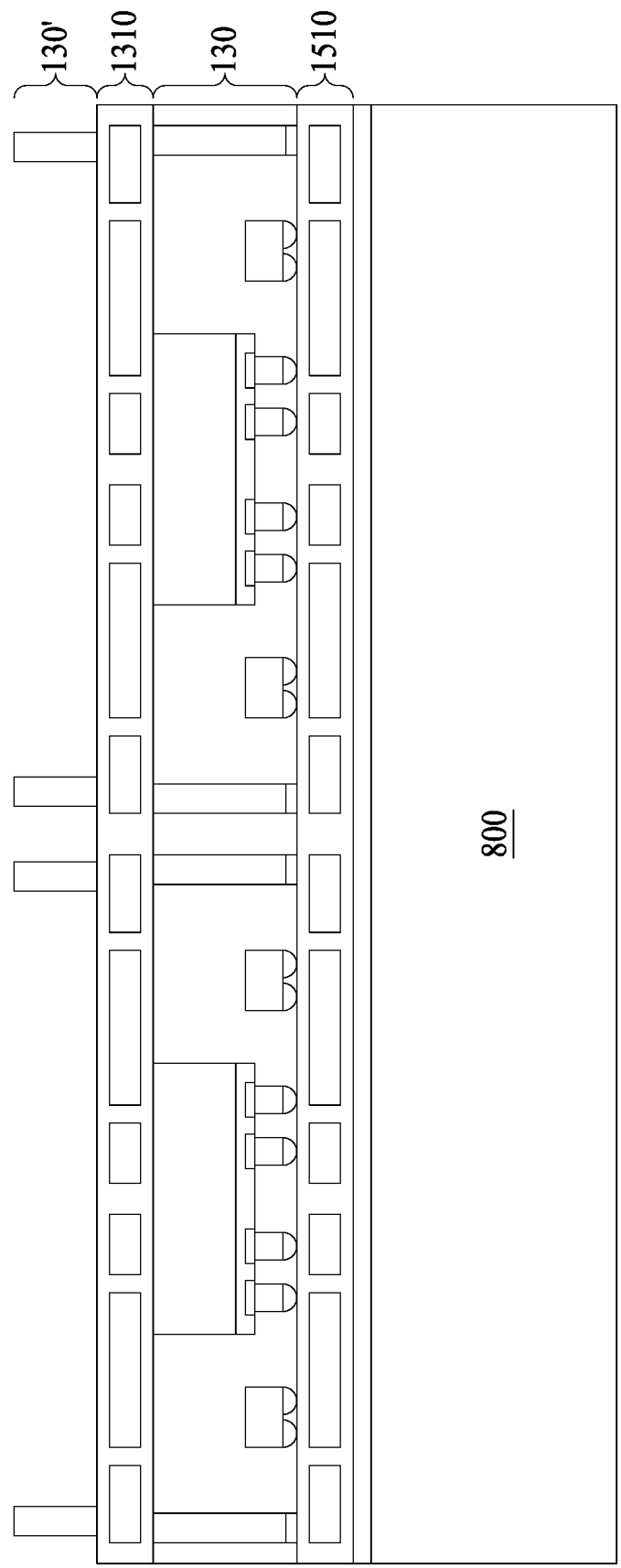
FIG. 9A to FIG. 9D show cross sectional views of a sequence of a method for manufacturing a semiconductor package, in accordance with some embodiments of the present disclosure.
Figure 9B:
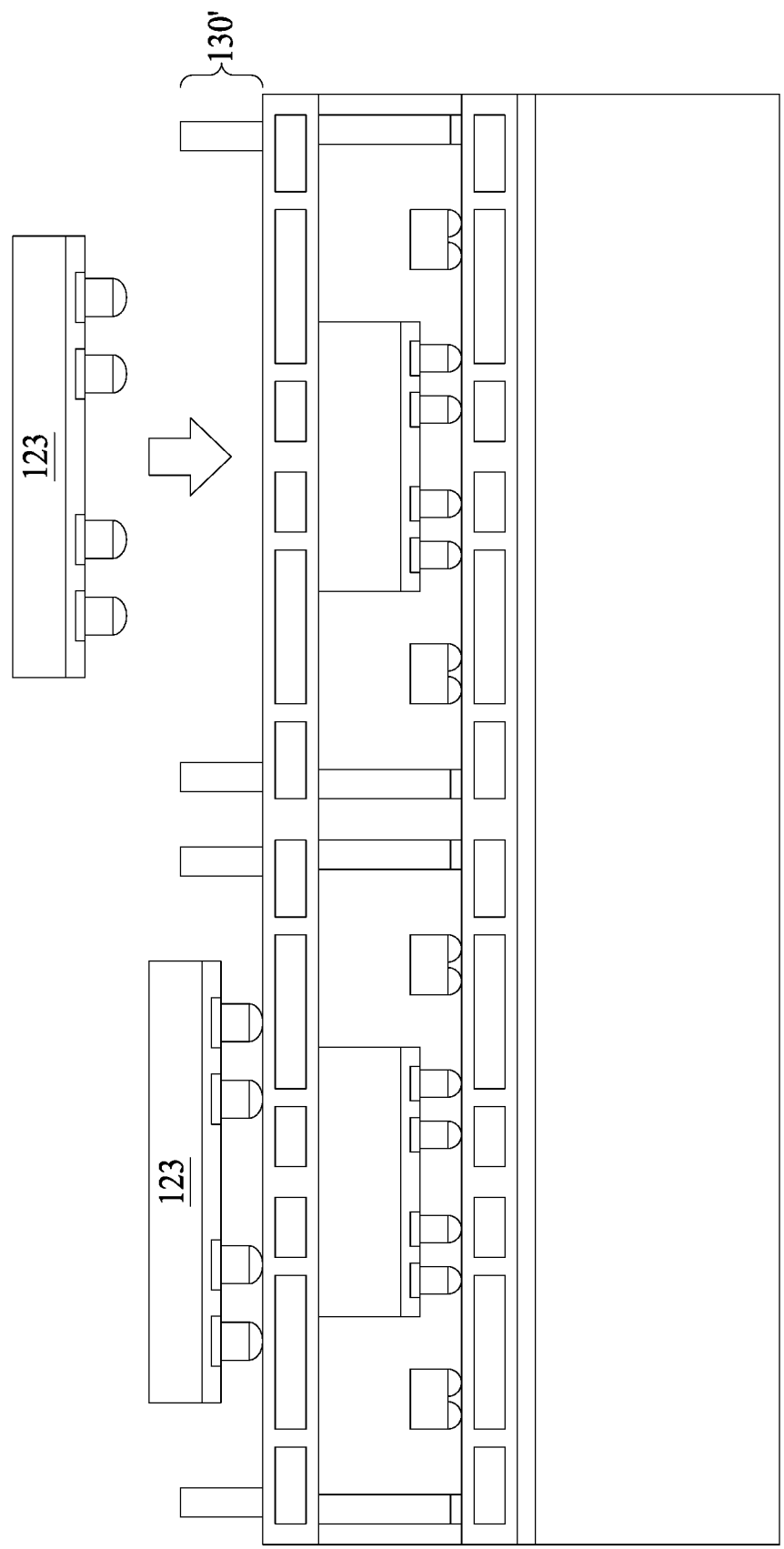
Figure 9C:
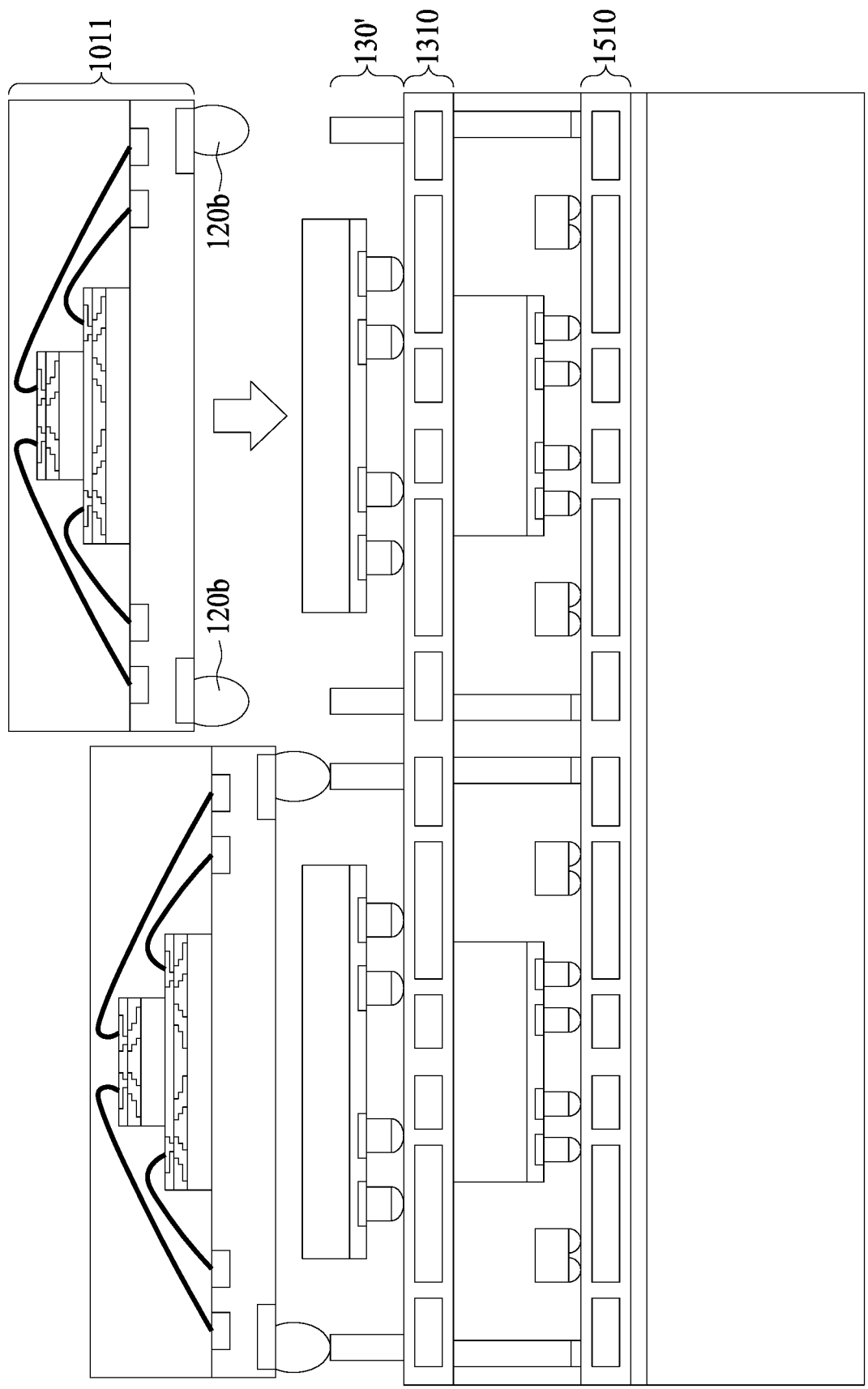
Figure 9D:
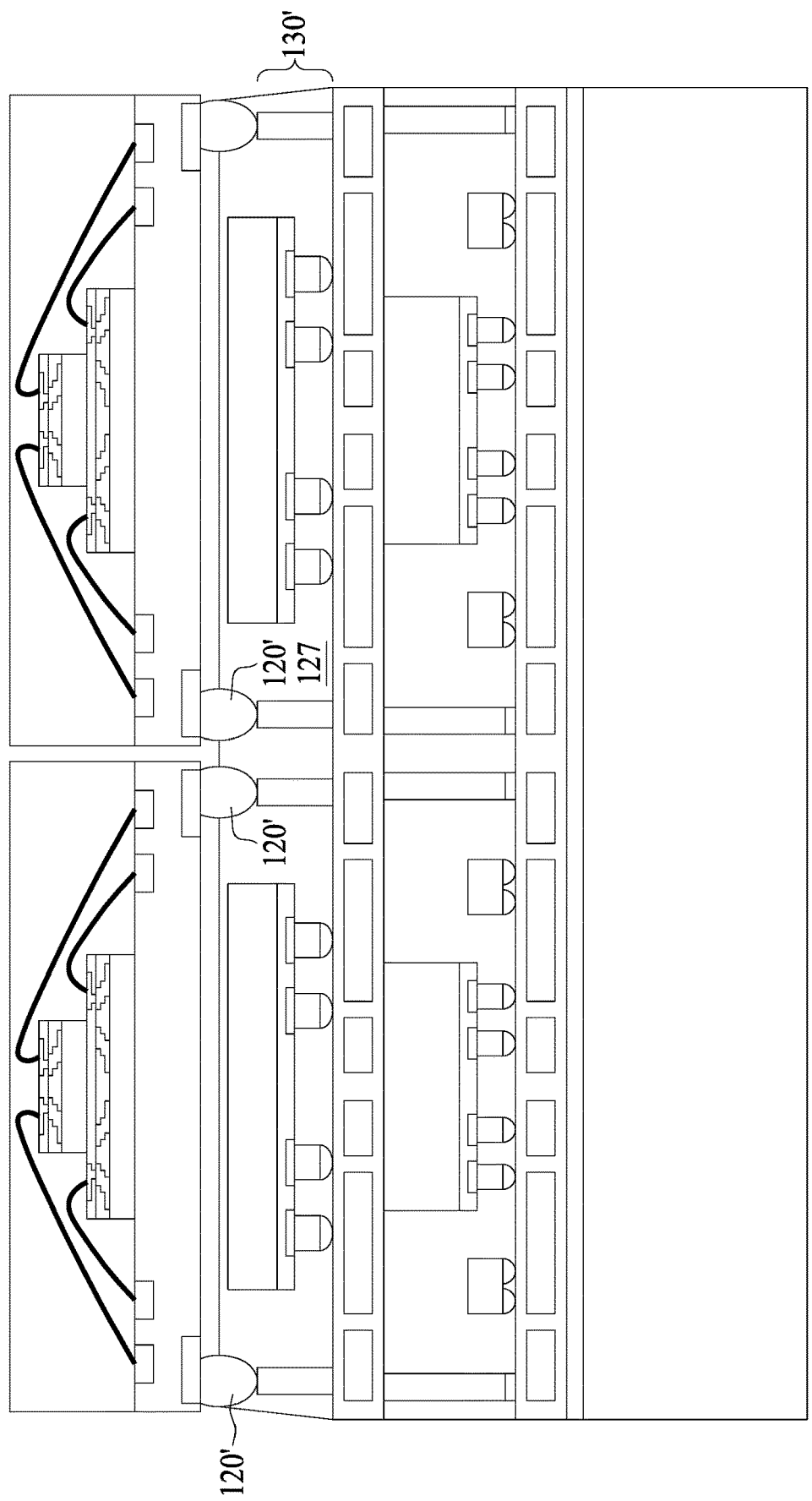

FIG. 9A to FIG. 9D show cross sectional views of a sequence of a method for manufacturing a semiconductor package 30, in accordance with some embodiments of the present disclosure. Manufacturing methods of semiconductor package 30 are similar to that of semiconductor package 10, as previously discussed, except for several operations illustrated from FIG. 9A to FIG. 9D. The manufacturing operations for semiconductor package 30 are substantially identical from FIG. 8A to FIG. 8D. In FIG. 9A, a conductive bump 130' is further formed over the upper RDL 1310 before the placement of the die 123 at the upper die structure, as illustrated in FIG. 9B. Underfill can be applied after mounting the die 123, or alternatively, after bonding the packaged die 1011 as illustrated in FIG. 9C. Packaged die 1011 with a solder ball 120*b*, which is smaller compared to that described in FIG. 8F, is attached to the conductive bump 130' via an alignment operation and a reflow operation in FIG. 9C. In FIG. 9D, an under fill 127 is applied to the upper die structure, encapsulating the die 123, the conductive bump 130', and the solder 120'. Following FIG. 9D, manufacturing operations depicted from FIG. 8H to FIG. 8J can be applied.

Some embodiments of the present disclosure provide a semiconductor package. The semiconductor package includes a first layer, a second layer, and a conductive array. The first layer includes a packaged die having a carrier surface and a molding surface, and a first die structure in proximity to the carrier surface. An active region of the first die structure is electrically coupled to the packaged die through a solder. The second layer includes a second die structure, the second die structure being connected to the active region of the first die structure by a first redistributed layer (RDL). The conductive array is connected to an active region of the second die structure by a second RDL.

Some embodiments of the present disclosure provide a multi-chip semiconductor structure. The multi-chip semiconductor structure includes a memory chip layer, a silicon-on-chip layer connected to the memory chip layer by a first redistributed layer (RDL) and a through insulator via, and a ball grid array connected to the SOC layer through a second RDL. The memory chip layer comprises a memory chip flip-chip bonded to the first RDL and surrounded by a solder.

Some embodiments of the present disclosure provide a method for manufacturing a semiconductor package. The method includes forming a bottom redistribution layer (RDL) over a glass substrate, forming a through insulator via (TIV) over the bottom RDL, flip-chip bonding a first die over the bottom RDL, molding the first die and the TIV, forming an upper RDL over the first die, flip-chip bonding a second die over the upper RDL, and stacking a third packaged die over the second die and electrically connecting the third packaged die to the first die through soldering.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor package, comprising:
    forming a bottom redistribution layer (RDL) over a glass substrate;
    forming a through insulator via (TIV) over the bottom RDL;
    flip-chip bonding a first die over the bottom RDL;
    molding the first die and the TIV;
    forming an upper RDL over the first die;
    flip-chip bonding a second die over the upper RDL;
    forming a solder on the upper RDL and laterally surrounds the second die;
    stacking a third packaged die over the second die and electrically connecting the third packaged die to the first die through soldering; and
    forming an underfill surrounding the second die and the solder;
    wherein the third packaged die having a carrier and a molding on the carrier, the carrier comprising a carrier surface and the molding comprising a molding surface, and the solder is in contact with the carrier surface of the third packaged die.

2. The method of claim 1, further comprising debonding the glass substrate from the bottom RDL.

3. The method of claim 1, further comprising etching back a debonded surface and exposing a conductive contact.

4. The method of claim 3, further comprising disposing a solder ball over the conductive contact.

5. The method of claim 4, further comprising disposing a third die at the same level of the solder ball.

6. The method of claim 1, wherein the first die comprises a plurality of dies having different thicknesses.

7. The method of claim 1, wherein the second die comprises a plurality of dies having different thicknesses.

8. A method for manufacturing a semiconductor package, comprising:
    forming a bottom redistribution layer (RDL) over a glass substrate;
    forming a first conductive bump over the bottom RDL;
    bonding a first die on the bottom RDL, the first die having a top surface coplanar with the first conductive bump;
    forming an upper RDL over the first die;
    forming a second conductive bump over the upper RDL;
    bonding a second die on the upper RDL; and
    stacking a third packaged die over the second die and electrically connecting the third packaged die to the first die through a solder bump;
    forming an underfill surrounding the second die, the second conductive bump, and a portion of the solder bump.

9. The method of claim 8, wherein stacking the third packaged die over the second die comprises an alignment operation and a reflow operation.

10. The method of claim 9, wherein the alignment operation comprises aligning the solder bump with the second conductive bump.

11. The method of claim 8, wherein forming the underfill is subsequent to stacking the third packaged die over the second die.

12. The method of claim 8, wherein forming the underfill is prior to stacking the third packaged die over the second die.

13. The method of claim 8, wherein the second conductive bump comprises a smaller height than that of the first conductive bump.

14. The method of claim 8, wherein the first die comprises a plurality of dies having different thicknesses.

15. A method for manufacturing a semiconductor package, comprising:
- forming a bottom redistribution layer (RDL) over a glass substrate;
- forming a conductive plug over the bottom RDL;
- bonding a first die on the bottom RDL, the first die having a top surface coplanar with the conductive plug;
- forming an upper RDL over the first die;
- bonding a second die on the upper RDL;
- stacking a third packaged die over the second die and electrically connecting the third packaged die to the first die through a conductive bump, a solder bump, the upper RDL and the bottom RDL; and
- forming an underfill surrounding the second die, the conductive bump, and a portion of the solder bump.

16. The method of claim 15, wherein stacking the third packaged die over the second die comprises disposing the solder bump of the third packaged die over the upper RDL.

17. The method of claim 15, further comprising forming the conductive bump over the upper RDL prior to bonding the second die over the upper RDL.

18. The method of claim 17, wherein stacking the third packaged die over the second die comprises aligning the solder bump of the third packaged die to the conductive bump over the upper RDL.

19. The method of claim 15, further comprising molding the first die and the conductive plug prior to forming the upper RDL.

20. The method of claim 15, wherein a top surface of the second die is higher than the two conductive bumps.

* * * * *